United States Patent [19]

Takubo et al.

[11] Patent Number: 5,162,896
[45] Date of Patent: Nov. 10, 1992

[54] IC PACKAGE FOR HIGH-SPEED SEMICONDUCTOR INTEGRATED CIRCUIT DEVICE

[75] Inventors: Chiaki Takubo, Yokohama; Kazutaka Saito; Toshio Sudo, both of Kawasaki, all of Japan

[73] Assignee: Kabushiki Kaisha Toshiba, Kawasaki, Japan

[21] Appl. No.: 652,371

[22] Filed: Feb. 7, 1991

Related U.S. Application Data

[63] Continuation of Ser. No. 201,963, Jun. 2, 1988, abandoned.

[30] Foreign Application Priority Data

| | | |
|---|---|---|
| Jun. 2, 1987 [JP] | Japan | 62-138630 |
| Jul. 9, 1987 [JP] | Japan | 62-169639 |
| Jul. 9, 1987 [JP] | Japan | 62-169640 |

[51] Int. Cl.$^5$ .............................................. H05K 5/06
[52] U.S. Cl. ..................................... 257/664; 257/668
[58] Field of Search ........................ 357/74, 68, 80, 71; 333/33, 70

[56] References Cited

U.S. PATENT DOCUMENTS

| | | | |
|---|---|---|---|
| 3,990,024 | 11/1976 | Hou | 333/33 |
| 4,477,817 | 10/1984 | Anderson | 333/17.3 |
| 4,600,907 | 7/1986 | Grellman et al. | 333/260 |
| 4,636,753 | 1/1987 | Geller et al. | 333/238 |
| 4,679,249 | 7/1987 | Tanaka et al. | 333/33 |
| 4,692,789 | 9/1987 | Nakamura et al. | 357/75 |
| 4,739,519 | 4/1988 | Findley | 333/26 |
| 4,751,482 | 6/1988 | Fukuta et al. | 357/74 |
| 4,920,406 | 4/1990 | Watanabe et al. | 357/75 |
| 5,021,866 | 6/1991 | Sudo et al. | 357/70 |

FOREIGN PATENT DOCUMENTS

| | | |
|---|---|---|
| 0148083 | 10/1985 | European Pat. Off. . |
| 0210371 | 4/1987 | European Pat. Off. . |
| 60-130132 | 7/1985 | Japan . |
| 62-128549 | 6/1987 | Japan . |

OTHER PUBLICATIONS

Perriard, "Muticontact Chip Holder for Integrated Cryogenic Circuits", IBM TDB, vol. 20, No. 3, Aug. 1977 p. 1220.
Patent Abstracts of Japan, vol. 10, No. 352 (E-458) [2408], 27th Nov. 1986; & JP-A-61 152 047 (Fujitsu Ltd) Oct. 7, 1986.
NEC Research & Development, No. 86, Jul. 1987, pp. 16-20, Tokyo, JP; M. Ouchi et al.: "A 100 ps ECL array with 1 GHz I/O buffer".
Patent Abstracts of Japan, vol. 12, No. 17 (E-574) [2864], 19th Jan. 1988; & JP-A-62 176 153 (NEC Corp.) Jan. 8, 1987.
Proceedings of the 5th Int'l Microelectronics Conf.: May 25-27, 1988, Sunshine City Prince Hotel, Tokyo, Japan: pp. v. 345-351.
Proceeding of the Technical Conference: 1991 Int'l Electronics Packaging Conf., San Diego, CA: Sep. 15-18, 1991; vol. 1, pp. 591-603.

Primary Examiner—Andrew J. James
Assistant Examiner—Viet Q. Nguyen
Attorney, Agent, or Firm—Oblon, Spivak, McClelland, Maier & Neustadt

[57] ABSTRACT

A tape-automated bonding substrate or TAB substrate used for mounting a gallium arsenide IC chip having external connection terminals including signal input and output terminals thereon is shown. Conductive thin-film wiring lines are formed on an insulative thin-film layer. These thin-film wiring lines include feed-through type signal input wiring lines to be connected to the input terminals of the chip. Each feed-through type signal input wiring line has an inner lead to which a corresponding signal input terminal of the chip is directly connected, a terminal pad for receiving a high-speed input signal, and a terminal pad to which an impedance-matching resistor is to be connected. The feed-through type signal input wiring lines have a composite line structure of micro-strip signal transmission and co-planar signal transmission line structures.

20 Claims, 22 Drawing Sheets

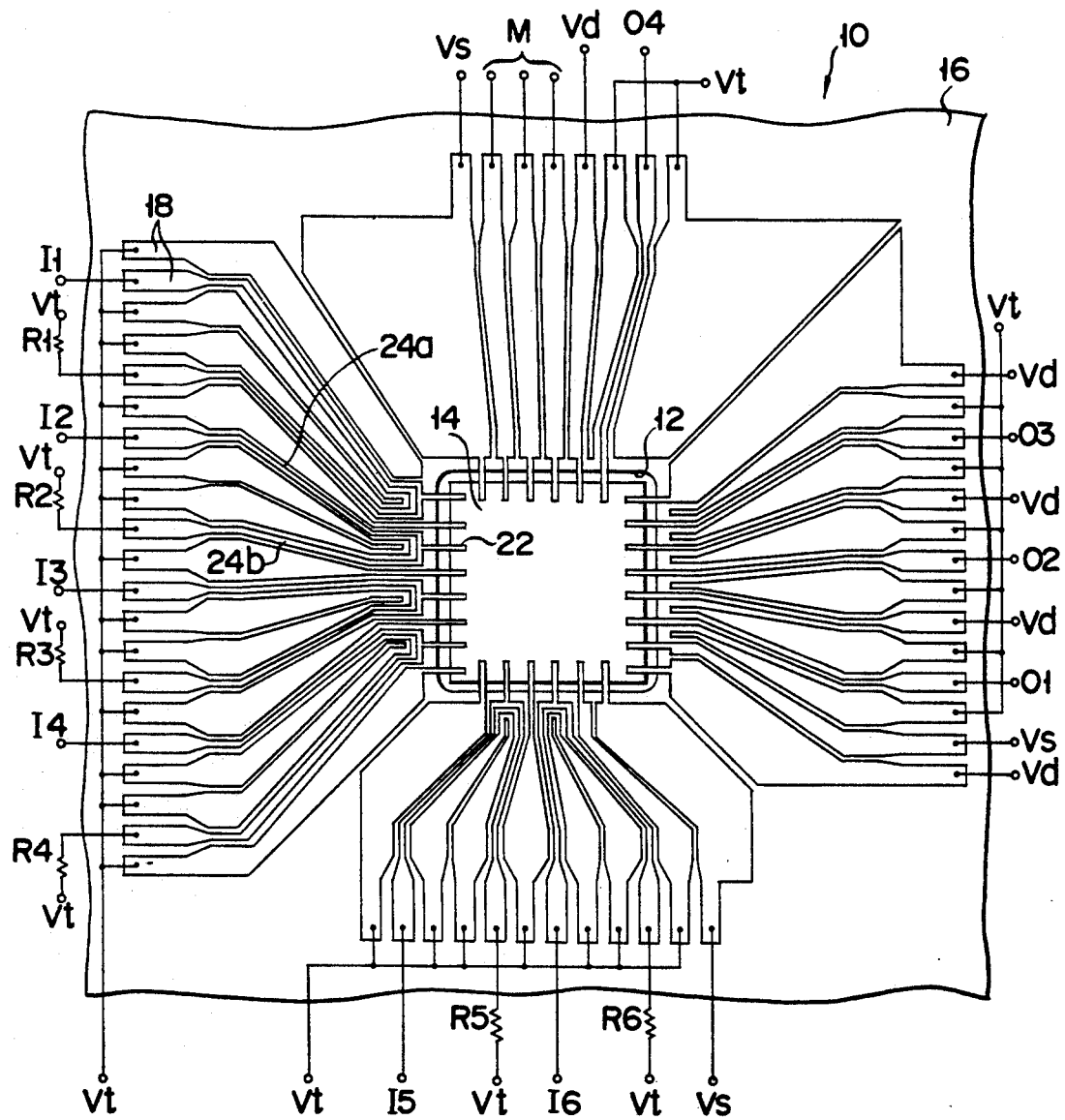
F I G. 3

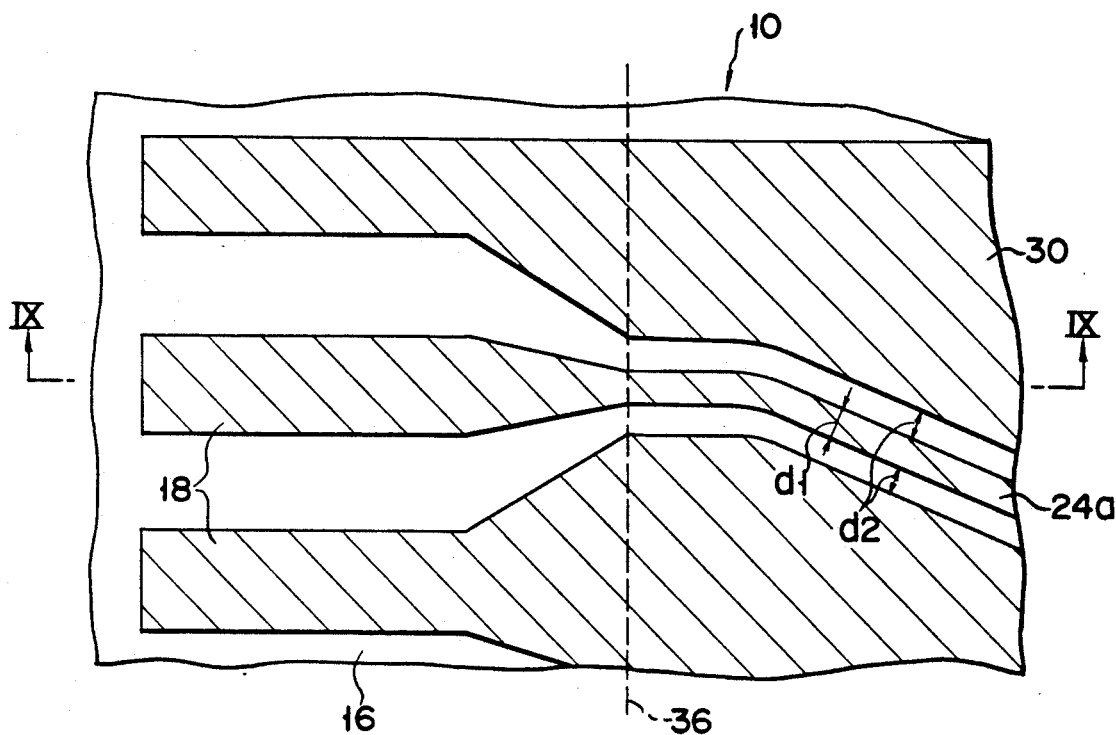
F I G. 8
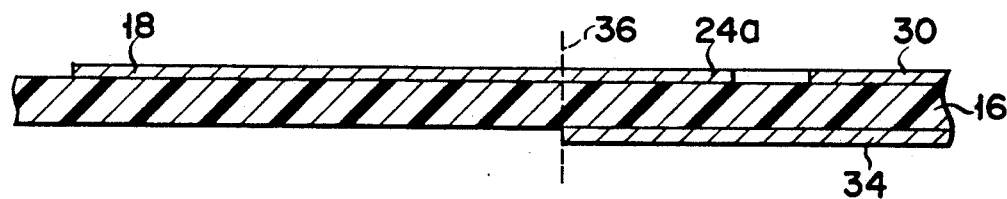
F I G. 9

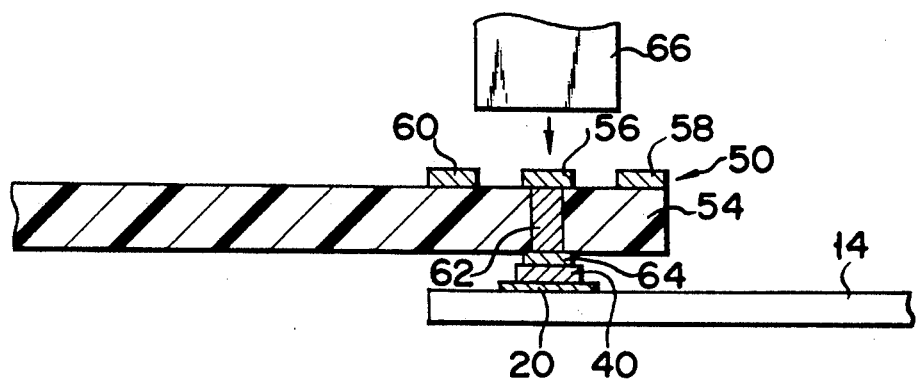
F I G. 17
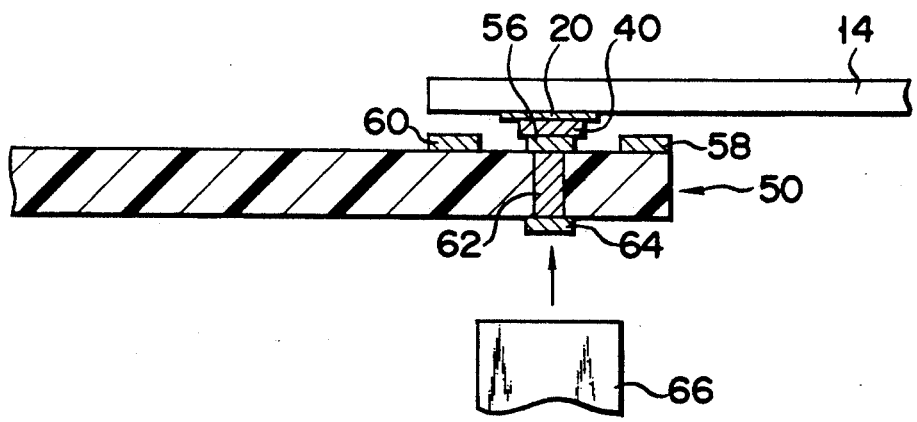
F I G. 18

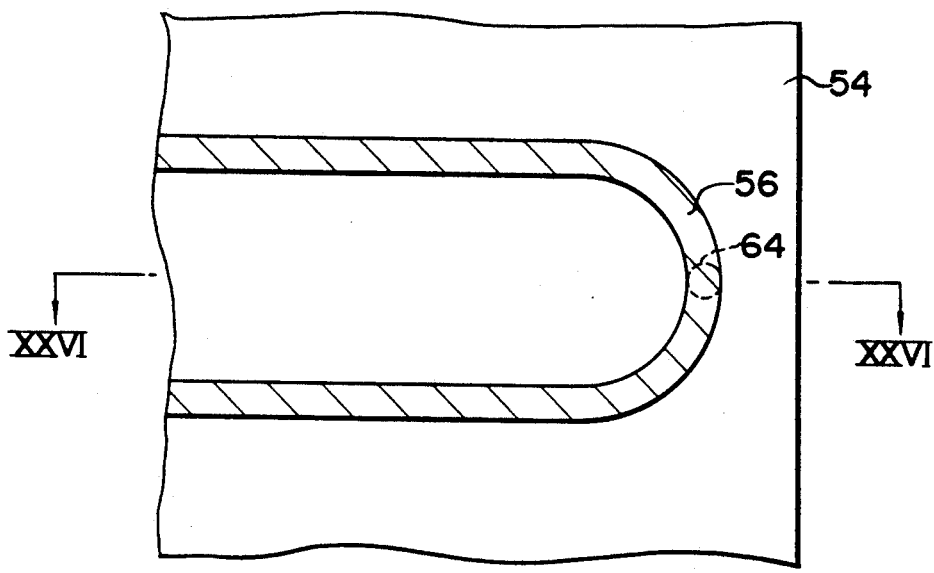
F I G. 25
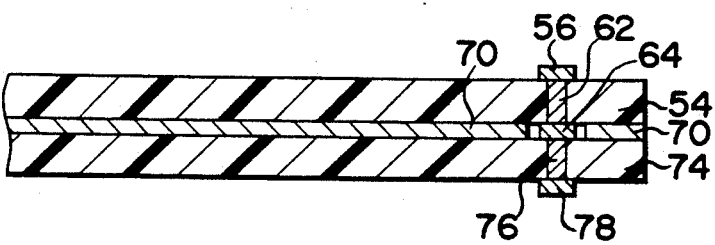
F I G. 26
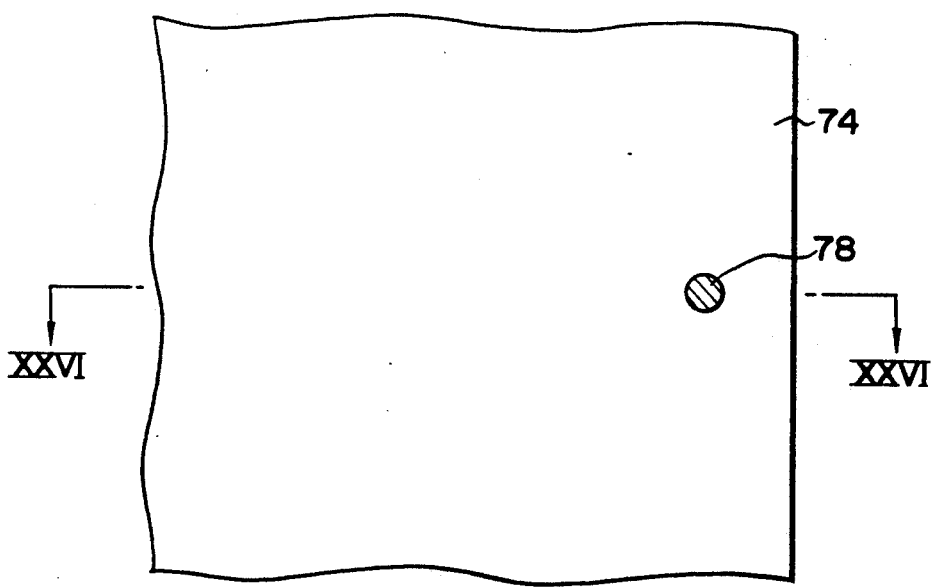
F I G. 27

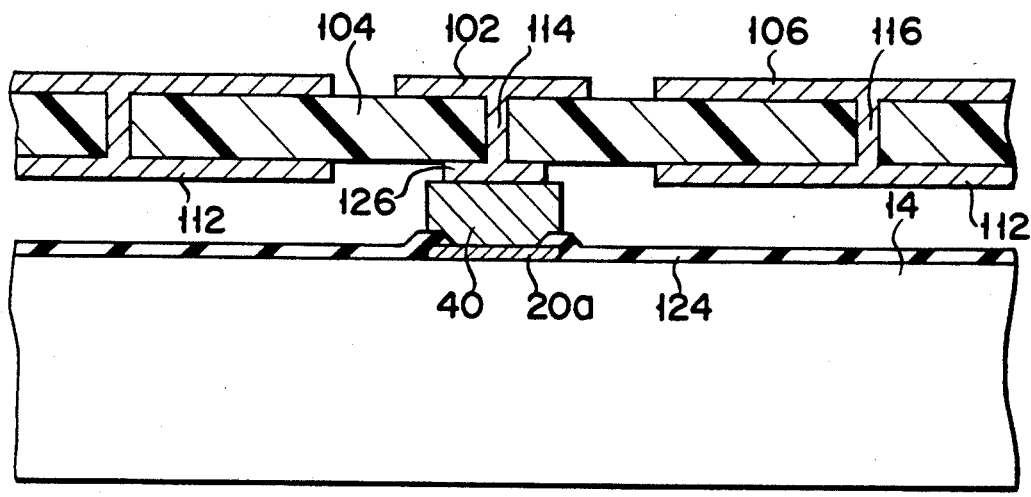
F I G. 33
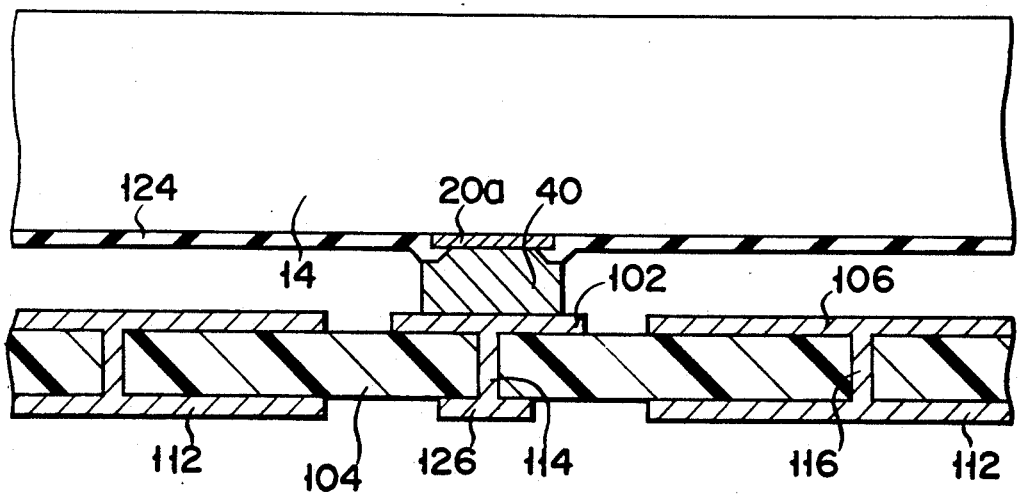
F I G. 34

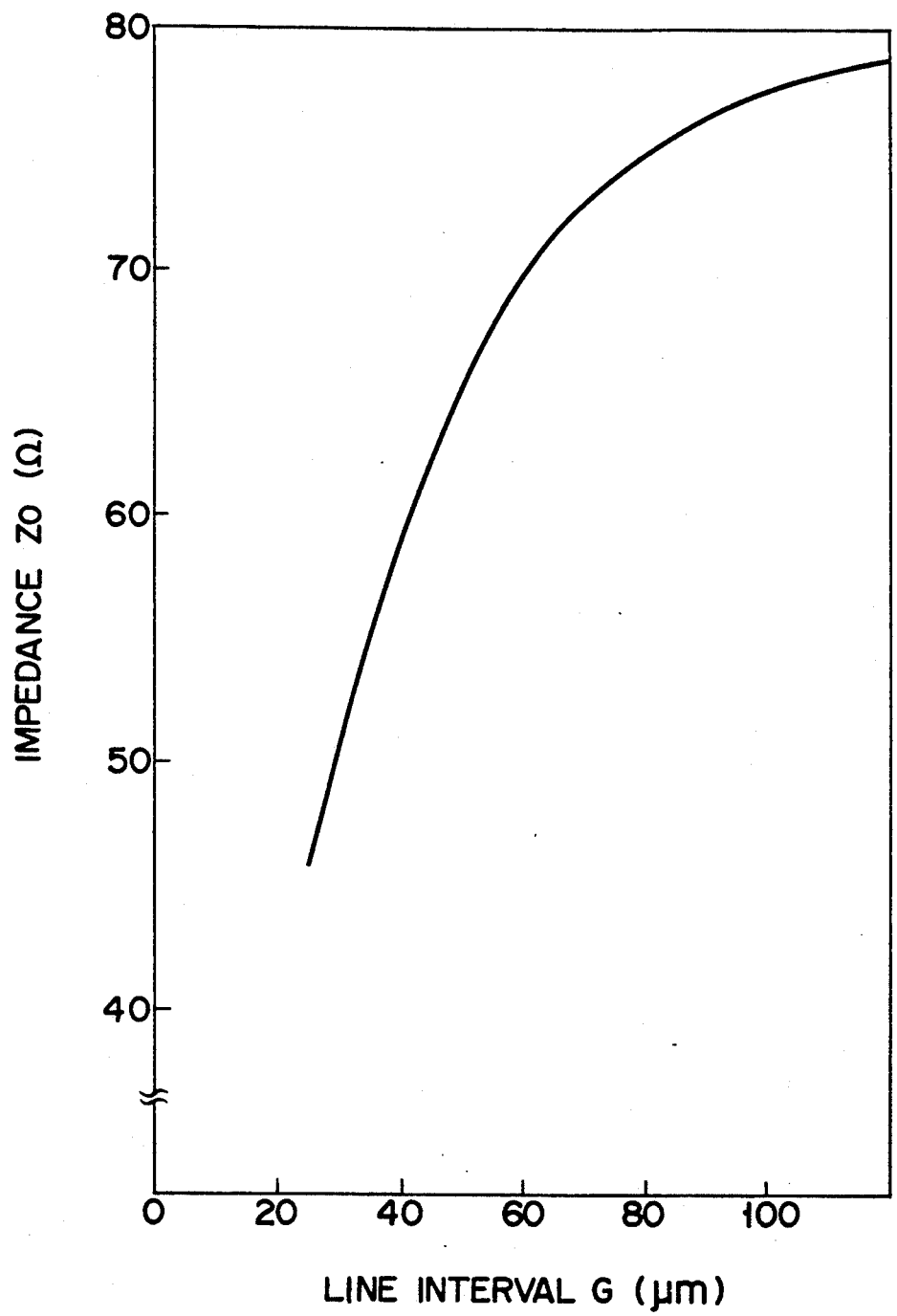
F I G. 36

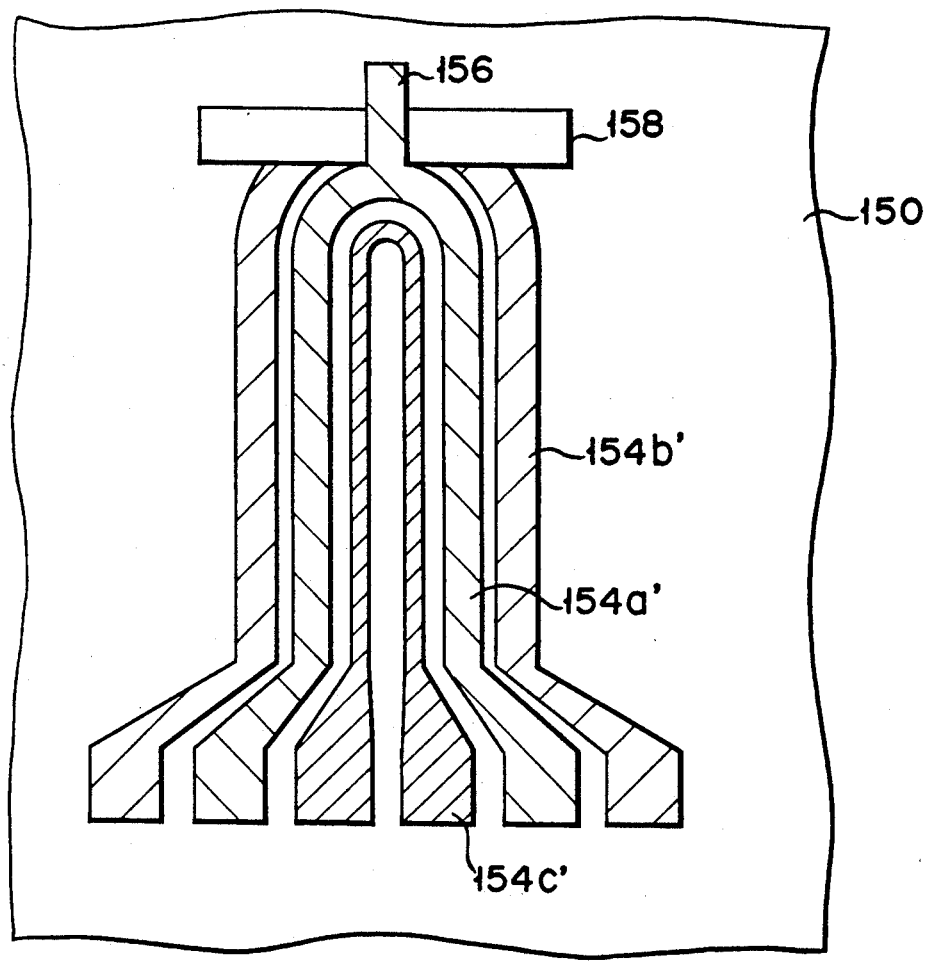
F I G. 38
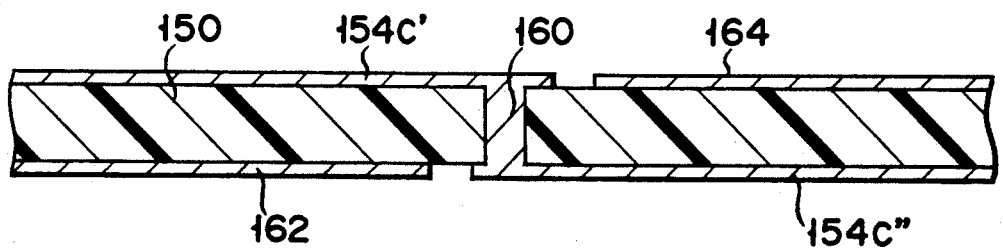
F I G. 39

1

IC PACKAGE FOR HIGH-SPEED SEMICONDUCTOR INTEGRATED CIRCUIT DEVICE

This application is a continuation of application Ser. No. 07/201,963, filed on Jun. 2, 1988, now abandoned.

BACKGROUND OF THE INVENTION

1. Field of the Invention

The present invention relates to a packaging technique of semiconductor integrated circuit devices and, more particularly, to mounting devices for semiconductor integrated circuit chips capable of high speed logic performance.

2. Description of the Related Art

With the increasing needs for high speed logic performance of digital systems, a great deal of attention is paid to gallium arsenide (to be referred to as GaAs hereinafter). Recently, integrated circuit devices capable of high speed logic performance at a switching speed of about 100 picoseconds have been developed by integrating GaAs Schottky gate field effect transistors (metal-semiconductor field effect transistors or "MES-FETs". The packaging technique of such high-speed devices, however, is still under development.

If chips of high-speed devices are mounted on packages of conventional structures, high performance of the devices themselves cannot be fully obtained. This is because high-speed signal transmission efficiency is degraded in the wiring (normally, bonding wiring) between the device chips and the packages. Degradation in signal transmission characteristic in IC packages results not only from degradation in impedance-matching in connecting terminals but also from the fact that, in high-speed transmission of logical signals, bonding wires themselves adversely behave as an "open stub", which degrades uniformity of signal processing characteristic of a device.

SUMMARY OF THE INVENTION

It is therefore an object of the present invention to provide a new and improved chip mounting arrangement for a semiconductor integrated circuit device capable of high speed logic performance.

It is another object of the present invention to provide a new and improved packaging device which can minimize degradation, caused by wiring, in signal transmission characteristic of a semiconductor integrated circuit device capable of high speed logic performance.

The above-described objects can be achieved by utilizing a tape-automated bonding substrate or "TAB substrate" as an IC package (which is mounted on a printed circuit board) for a chip of semiconductor integrated circuit device in place of an IC package using bonding wires, and combining the TAB substrate with a feed-through wiring line pattern. In this case, connecting terminal pads of the IC chip, which include high-speed signal input and output terminals, are directly bonded to the corresponding inner leads of a signal wiring line pattern formed by a conductive thin-film layer formed on an insulative sheet-like layer. The lead terminals of the TAB substrate to be connected to the signal input terminal pads of the IC chip especially have a "feed-through wiring line structure". Each of such feed-through type signal input wiring lines can be realized either by a "bent type" structure constituted by two branched sub-wiring lines radially extending in the V-shaped form, one of which receives an input signal and the other of which is connected to an impedance-matching resistor, i.e., a terminal resistor; or by a "straight type" structure constituted by a straight wiring line, which includes a conductive through-hole to be directly connected to a corresponding signal input terminal of the IC chip, the straight wiring line having first and second terminals one of which receives the input signal and the other of which is to be connected to the resistor.

The present invention and its objects and advantages will become more apparent from the detailed description of preferred embodiments to be presented below.

BRIEF DESCRIPTION OF THE DRAWINGS

In the detailed description of preferred embodiments of the invention presented below, reference is made to the accompanying drawings of which:

FIG. 3 is a diagram showing an overall plan view of a TAB substrate which is an IC packaging device according to a preferred embodiment of the present invention;

FIG. 8 is a diagram showing a further enlarged plan view of a peripheral portion along external wiring terminal pads of the TAB substrate in FIG. 3;

FIG. 9 is a diagram showing a sectional structure taken along line IX—IX of the TAB substrate in FIG. 8;

FIG. 17 is a diagram showing a sectional view of the TAB substrate in FIGS. 14 to 16, having a lower surface on which an IC chip is mounted;

FIG. 18 is a diagram showing a sectional view of the TAB substrate in FIGS. 14 to 16, having an upper surface on which an IC chip is mounted;

FIGS. 25 to 27 are diagrams showing still another modification of the TAB substrate in FIGS. 14 to 16;

FIG. 33 is a diagram showing a partial sectional structure taken along line XXXIII—XXXIII of the TAB substrate in FIG. 32;

FIG. 34 is a diagram showing a modification of the sectional structure of the TAB substrate in FIG. 33;

FIG. 36 is a graph of experimental measurement results showing changes in characteristic impedance Zo in accordance with changes in line interval G in the TAB substrates according to the above embodiments;

FIGS. 38 to 42 are diagrams showing a modification of a test wiring line pattern to be arranged in the fourth embodiment of FIG. 37.

DETAILED DESCRIPTION OF THE PREFERRED EMBODIMENTS

In order to facilitate understanding of the present invention, a conventional IC packaging device will be described in further detail with reference to FIGS. 1 and 2 prior to a description of embodiments of the present invention.

If a semiconductor integrated circuit device (to be referred to as an "IC device" hereinafter) capable of high speed logic performance is stored o mounted in a conventional package such as a Dual In line Package, Flat Package, Pin Grid Array Package, etc., by a conventional chip wiring technique using boding wires, the signal processing performance to be obtained from a signal chip is degraded. This results from the fact that it is difficult to properly set impedance matching in a package substrate for exchanging high-speed logical signals with the chip, such as undesirable behaviors of the bonding wires themselves, i.e., degradation in signal transmission characteristic.

When a high-speed input signal is supplied to an FET included in a signal input section of a GaAs IC chip capable of high speed logic performance through an inner signal wiring line of a package substrate, if signal reflection is caused at a gate of the FET, the waveform of the signal i distorted. This degrades the normal logic performance of the IC chip. In order to prevent this signal reflection, an impedance-matching resistor must be arranged between the package substrate and an external printed circuit board. One end of the impedance-matching resistor is connected to terminal voltage Vt and hence is also called a "terminal resistor".

Figure 1:
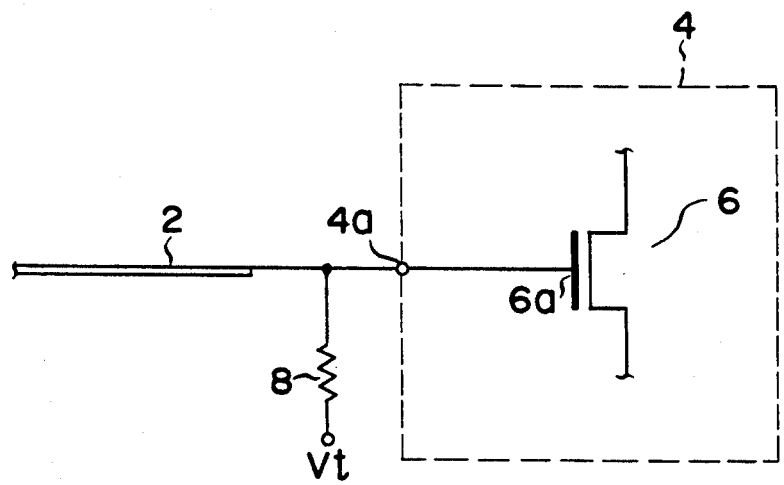
FIG. 1 is a diagram showing an equivalent circuit of a conventional IC packaging device whose external connection terminal is connected to an impedance-matching resistor (terminal resistor)

FIG. 1 shows en equivalent circuit diagram of a circuit arrangement wherein an IC chip is mounted on a conventional package and a terminal resistor is added to a lead terminal for receiving a high-speed input signal. Referring to FIG. 1, reference numeral 2 designates a signal input line of an external printed circuit board. Block 4 defined by a broken line represents a package, which contains input FET 6. Gate electrode 6a of FET 6 is connected to signal input line 2 through lead terminal 4a which is a signal input terminal of package 4. Terminal resistor 8 is connected between lead terminal 4a and terminal voltage Vt so as to perform impedance matching.

Terminal resistor 8, however, cannot function effectively for an IC chip capable of performing a high-speed logic operation at a switching speed as high as 100 picoseconds. This is because a wiring line, including bonding wire, between package terminal 4a serving as a matching terminal portion and gate portion 6a of input FET 6 constitute an "open stub", which causes ringing of input signals.

In order to solve this problem, it is required that the connecting point (impedance matching adjusting position) of impedance-matching resistor 8 must be located at the nearest position to gate 6a of input FET 6 in package 4, thereby minimizing the length of the open stub.

Figure 2:
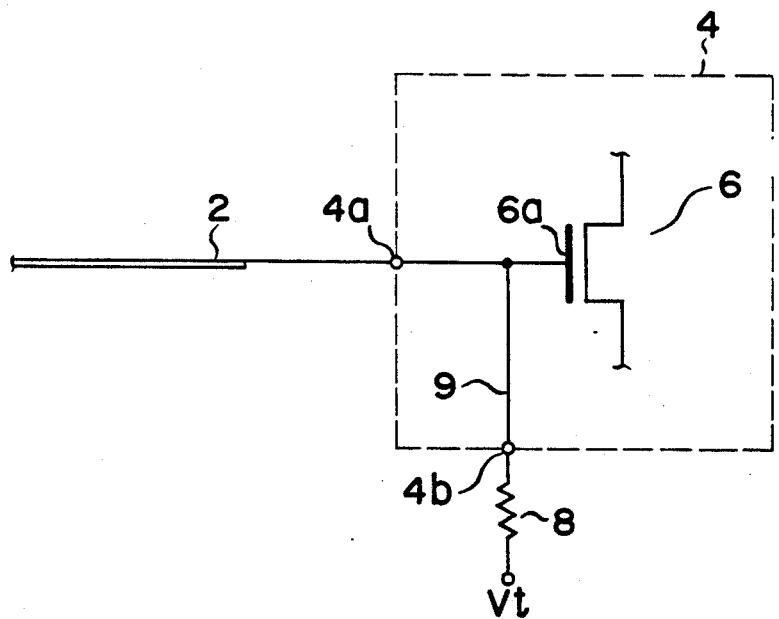
FIG. 2 is a diagram showing an equivalent circuit of another conventional IC packaging device whose external connection terminal is connected to an impedance-matching resistor (terminal resistor) in accordance with a "feed-through" system.

A "feed-through" system shown in FIG. 2 is known as a method of connecting terminal resistor 8 to package 4. According to this method, signal wiring line 9 is connected near gate portion 6a of FET 6. Signal wiring line 9 extends inside package 4 so as to be connected to lead terminal 4b additionally arranged in package 4. Terminal resistor 8 is externally connected to lead terminal 4b. According to this wiring method, the "open stub length" can be shortened compared with the case in FIG. 1.

Such a conventional arrangement, however, still suffers from degradation in signal transmission characteristic, which is inherent to the wire bonding technique. If the signal processing speed of an IC chip is increased as high as giga bit/sec, bonding wires for connecting the IC chip and a package substrate begin to function as an "open stub", thereby degrading the signal transmission characteristic. Deviation in length and shape of the bonding wires serves to further degrade the uniformity of signal transmission characteristic.

The above-described problems in such conventional packaging devices can be effectively solved by the embodiments of the present invention to be described in detail below.

FIG. 3 shows a chip mounting arrangement as an IC packaging device (not drawn to scale) according to one preferred embodiment of the present invention. This packaging device uses a specific substrate according to the Tape-Automated Bonding technique (normally, called a "TAB substrate" in this technical field), which is generally designated by reference numeral 10. TAB substrate 10 includes square opening 12 at its substantially central portion. GaAs semiconductor IC chip 14 is arranged in square opening 12. IC chip 14 may be a multiplexer unit which is constituted by GaAs MESFETs and is capable of performing a high-speed logic operation at a switching speed as high as 100 picoseconds.

Figure 4:
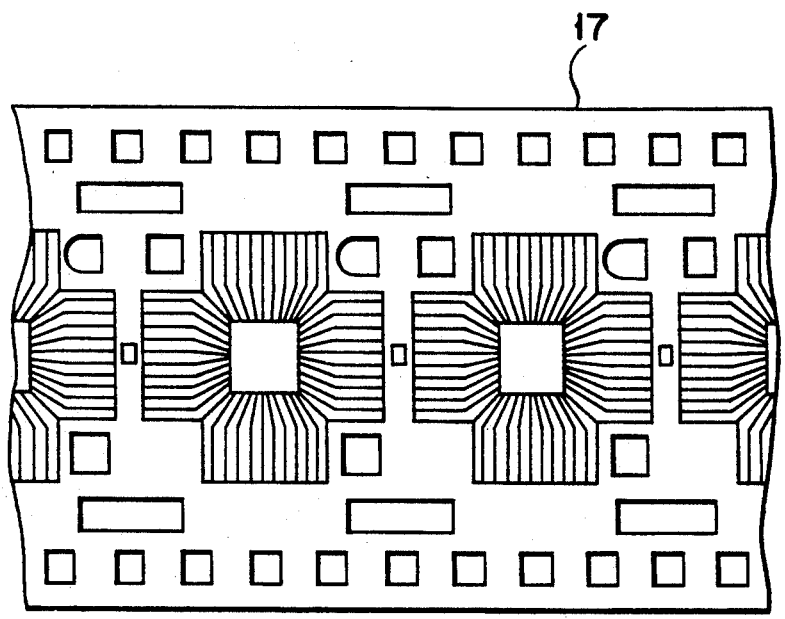
FIG. 4 is a diagram showing a partial plan view of a tape-like film carrier strip on which the TAB substrates according to the present invention are continuously formed.

TAB substrate 10 comprises resin film 16 composed of polyimide or glass epoxy, and a thin-film wiring line pattern defined on film 16 by photoetching. Normally, TAB substrates 10 are formed on tape-like film carrier strip 17 shown in FIG. 4 such that the wiring line patterns are repeatedly formed. TAB substrate 10 for a single package is obtained by cutting the strip in FIG. 4.

Figure 5:
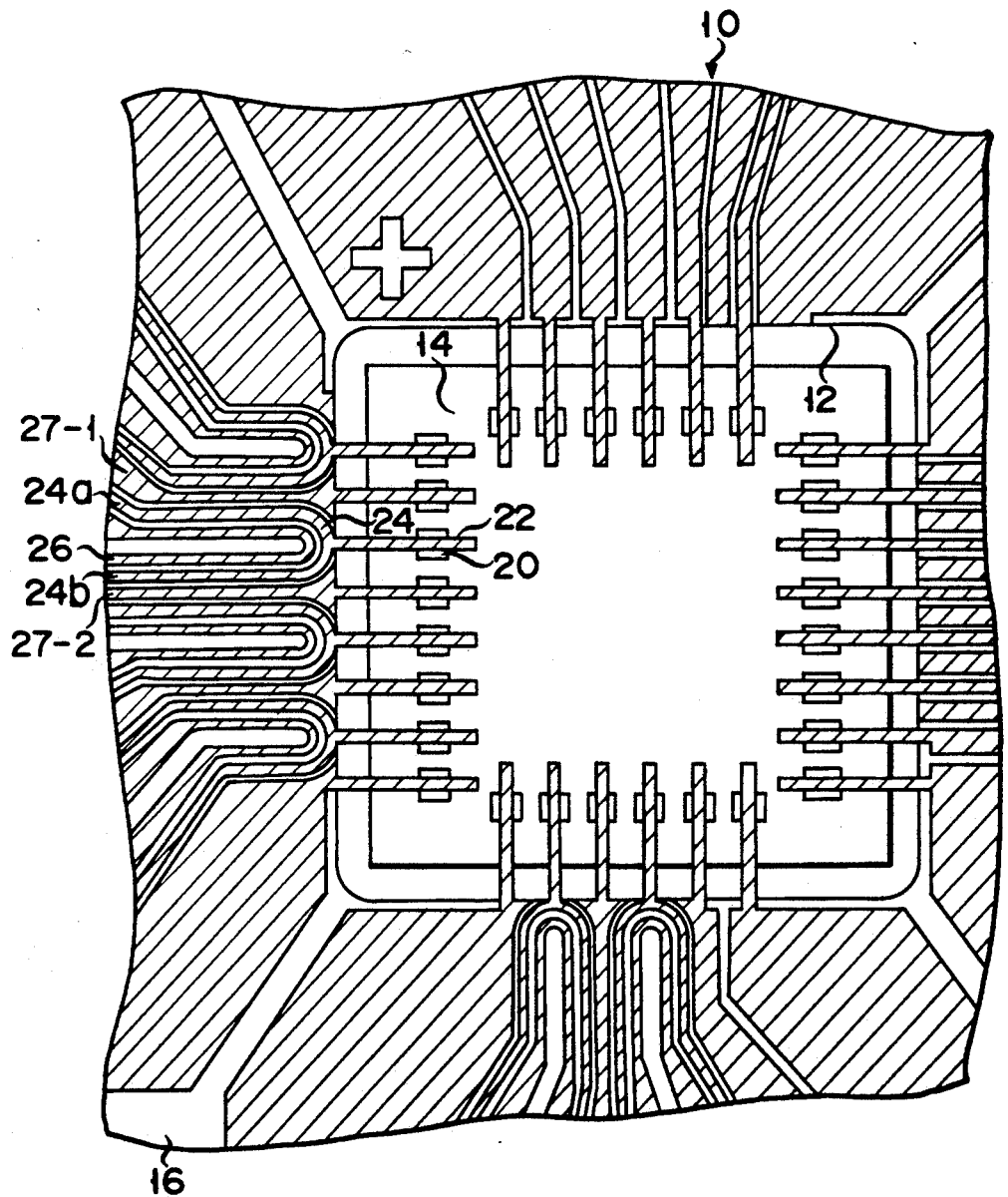
FIG. 5 is a diagram showing an enlarged view of a central portion of the TAB substrate in FIG. 3 which includes a square opening in which an IC ship is to be mounted.

As shown in FIG. 3, the wiring line pattern of TAB substrate 10 is constituted by copper (Cu) thin-film lead wiring lines radially extending from square opening 12 on resin film 16. The ends of signal wiring lines to be connected to the connecting terminal pads of IC chip 14 extend inwardly from the edges of opening 12 as "tongues". FIG. 5 shows an enlarged and further detailed view of the wiring line pattern around opening 12 of TAB substrate 10 so as to facilitate understanding of the pattern.

Connecting lead terminals 18 constituting the peripheral portion of TAB substrate 10 serve to connect TAB substrate 10 having IC chip 14 mounted thereon to the corresponding terminals of a currently available external printed circuit board (not shown). TAB terminals 18 include signal input terminals I1 to I6, signal output terminals O1 to O4, terminals to be connected to first power source voltage Vd, terminals to be connected to second power source voltage Vs, signal monitoring terminals M, and "feed-through" terminals to be connected to terminal voltage Vt through impedance-matching resistors or terminal resistors R1 to R6. Terminal voltage Vt may be a ground voltage or a voltage of a fixed potential level.

The signal output terminals of IC chip 14 mounted on TAB substrate 10 are respectively connected to output terminals O1 to O4, as shown in FIG. 3. The terminal voltage Vt wiring lines run on the both sides of each signal output line on resin film 16. The power source terminals of IC chip 14 are connected to corresponding power source terminals Vd and Vs of TAB substrate 10.

An arrangement of the TAB wiring lines to be connected to six signal input terminals I1 to I6 of IC chip 14 will now be described. According to this embodiment, the TAB wiring line pattern is designed such that terminal resistor R is externally connected to each input terminal in accordance with the "feed-through" technique. One of input terminal pads 20 of IC chip 14 (see FIG. 5) will be described below. Other terminals have substantially the same "feed-through" connection arrangements.

Referring to FIG. 5, a TAB wiring line tongue (to be referred to as an "interconnection lead" or an "inner lead" hereinafter in the description) to be connected to signal input terminal 20 of multiplexer IC chip 14 is designated by reference numeral 22. TAB inner lead 22 has half loop pattern 24 on TAB substrate film 16. One end portion of half loop pattern 24 is connected to one of TAB terminals 18, to which terminal I2 is connected, whereas the other end portion thereof is connected to another one of TAB terminals 18, to which terminal resistor R2 is connected as shown in FIG. 3. In other words, TAB inner lead 22 is branched into two wiring lines 24a and 24b. Wiring line 24a substantially radially extends on resin film 16 to be connected to terminal I2, whereas wiring line 24b substantially radially extends to be connected to terminal voltage Vt through resistor R2. As a result, a "feed-through" structure is obtained.

Another half loop pattern 26 is formed inside half loop pattern 24 on resin film 16 (to be more easily understood by referring to the illustration in FIG. 5). Half loop pattern 26 extends along branch wiring lines 24a and 24b of TAB inner lead 22 such that both the end portions of half loop pattern 26 are connected to terminal voltage Vt. Half loop pattern 24 is surrounded, at its both outer sides, by ground lines 27-1 and 27-2, which are respectively connected to TAB inner leads 22 neighboring to the aforementioned inner lead for half loop pattern 24.

According to this embodiment, the TAB wiring line pattern uses a composite structure of a "micro-strip signal transmission line structure" and a "co-planar signal transmission line structure", i.e., a "grounded co-planar signal transmission line structure" (or a "co-planar micro-strip signal transmission line structure") for branch wiring lines 24a and 24b. More specifically, as is apparent from the enlarged view of FIG. 6, the widths of branch wiring lines 24a and 24b from each inner lead 22 are set to be substantially constant (d1). Half loop pattern 26 for ground wiring located inside branch half loop pattern 24 of TAB inner lead 22, and wiring lines 30 and 32 located outside half loop pattern 24 are formed so as to define constant space distances d2 between them, thereby constituting the "co-planar signal transmission line structure".

Figure 7:
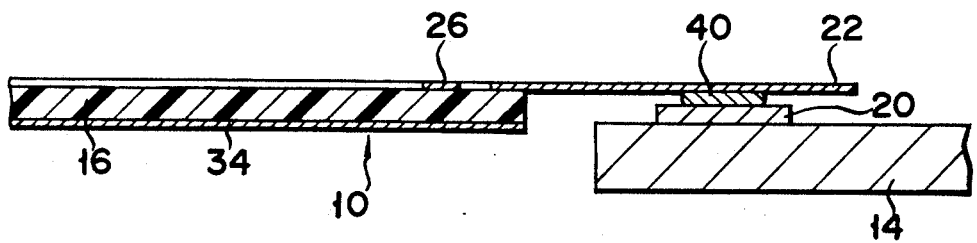
FIG. 7 is a diagram showing a sectional structure taken along line VII—VII of the TAB substrate in FIG. 6.

As shown in FIG. 7, conductive layer 34 to which terminal voltage Vt is applied is formed on the rear surface of TAB resin film 16 to constitute the "micro-strip signal transmission line structure". As is apparent from FIGS. 8 and 9, rear conductive layer 34 is formed so as not to overlap TAB terminals 18 in a plane. It will be understood from FIGS. 8 and 9 that rear conductive layer 34 is formed on the overall rear surface of resin film 16 except for the TAB terminals 18 formation region, i.e., the inside region of the TAB substrate indicated by broken line 36 in FIG. 8. In TAB substrate inside front surface region 36, branch wiring lines 24a and 24b of each inner lead 22 (similarly, the TAB wiring lines to be connected to the output terminals of IC chip 14) are bent and run in a concentrical manner while keeping constant distance d2 to the ground wiring lines located at their both sides. With this arrangement, "grounded co-planar signal transmission lines" having substantially constant characteristic impedance are formed.

Figure 6:
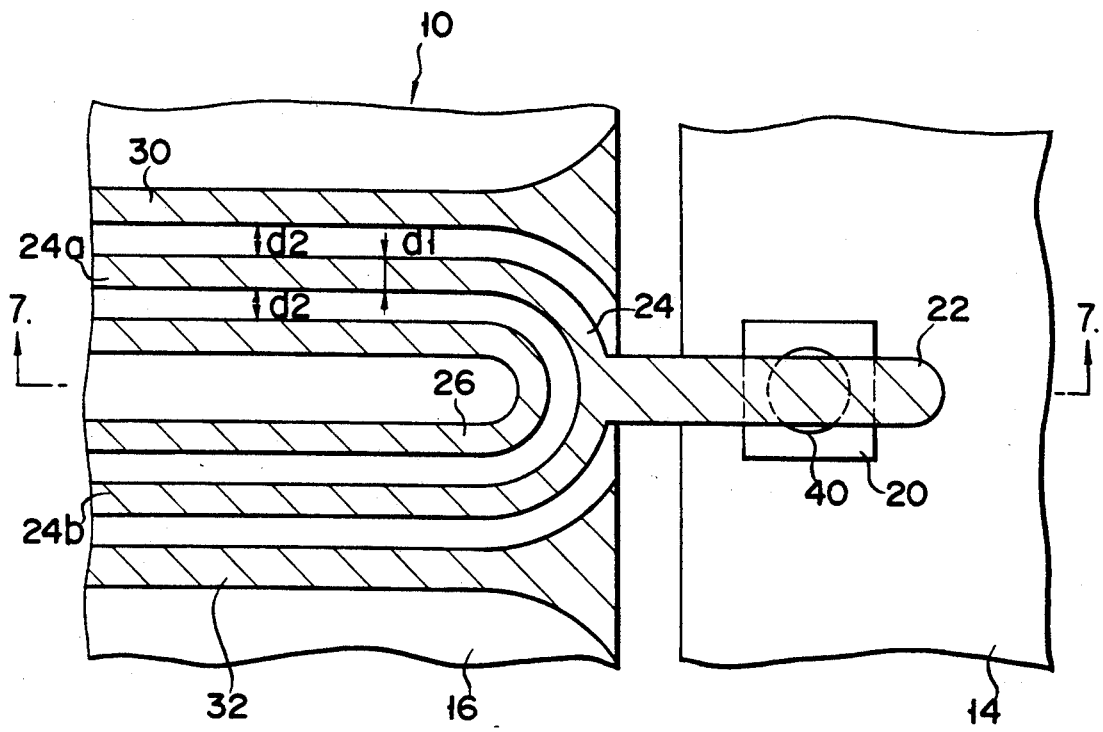
FIG. 6 is a diagram showing a further enlarged view of an electrically connecting portion between the TAB substrate in FIG. 3 and an IC chip mounted thereon.

As shown in FIGS. 6 and 7, each inner lead 22 is directly connected to the corresponding terminal pad 20 (Au, Al, or Al-alloy) of GaAs multiplexer IC chip 14 by bump electrode 40. Bump electrode 40 is formed by gold-plating a multi-layered barrier layer such as Ti-Ni-Pd, Ti-W, Ti-Pt, and Cr-Cu. When TAB inner leads 22 are composed of copper thin film these leads are Sn-plated or Au plated in advance. In order to bond each inner lead 22 to the corresponding bump electrode 40, a contact bonding tool (called a "bonding tool" or more simply a "bonder") having a temperature of 350° to 500° C. is urged against a bonding portion at a pressure of 30 to 80 g/lead. As a result, eutectic bonding (for a combination of Au-Sn) or thermocompression boding (for a combination of Au-Au) is performed therebetween so that IC chip 14 can be reliably fixed and mounted on TAB substrate 10 with a proper mechanical strength.

This TAB substrate, on which the IC chip is mounted, is cut off from carrier strip 17 (see FIG. 4) at peripheral lines along which TAB terminals 18 are aligned. The TA substrate is positioned such that the front surface thereof faces a printed pattern side of an external printed circuit board (not shown), and then subjected to known connecting process such as soldering or pressing, whereby each TAB terminal 18 is connected to the corresponding connection pattern of the printed circuit board. At this time, terminal resistors R1 to R6 are connected to the TAB terminals as shown in FIG. 3. Conductive layer 34 is applied with terminal voltage Vt by using a lead externally provided or a through-hole for electrically connecting the conductive layer 34 to a certain front wiring pattern to which terminal voltage Vt is also applied, for example, wiring pattern 27.

Practical numerical values for a lead wiring line design will now be presented When a GaAs logic integrated circuit having an interface compatible with, e.g., an ECL circuit is to be designed, the characteristic impedance of each input signal wiring line is set to be 50 $\Omega$ and a 50-$\Omega$ terminal resistor is added. Assuming that resin film 16 has a thickness of 75 $\mu$m and a dielectric constant of about 3.2, then a characteristic impedance of 50 $\Omega$ is obtained by setting the widths of lead wiring lines 24a and 24b to be 50 $\mu$m and the distance between lead wiring lines 24a and 24b, and lead wiring line 26 to be 30 $\mu$m.

According to this embodiment, by arranging feed-through wiring lines on a TAB substrate, signal input wiring lines each having a constant characteristic impedance can be formed even if an integrated circuit having a large number of signal input terminals is mounted. This is because lead wiring lines are formed on the TAB substrate by photoetching unlike on a conventional ceramic package, so that a wiring line structure having small line widths and intervals can be easily obtained with excellent controllability. Therefore, the problems due to an increased number of input terminals and high integration density of an integrated circuit can be easily treated. In addition, since wire boding is not employed, an open stub is decreased in size. Therefore, distortion of a signal waveform can be restricted, and uniformity of the lengths of open stubs can be improved. As a result, the high speed performance of the GaAs logic integrated circuit chip is sufficiently achieved.

A manufacturing method according to the embodiment described with reference to FIGS. 3 to 9 will be described as follows. Holes serving as integrated circuit chip mounting portions and the like are formed in a 35-mm wide resin film with a perforation. Then, a 18-$\mu$m thick Cu thin-film layer is adhered to the rear surface of the resin film using a polyimide adhesive agent. The Cu thin-film layer on the rear surface is processed into a predetermined pattern by photoetching. After this, another 18-$\mu$m thick Cu thin-film layer is adhered to the front surface of the resin film in the same manner as described above. The rear surface is coated with a photoresist. A photoresist having a predetermined pattern is formed on the front surface and is photoetched to form a wiring line pattern. Finally, the photoresists on the front and rear surfaces are removed.

Figure 10:
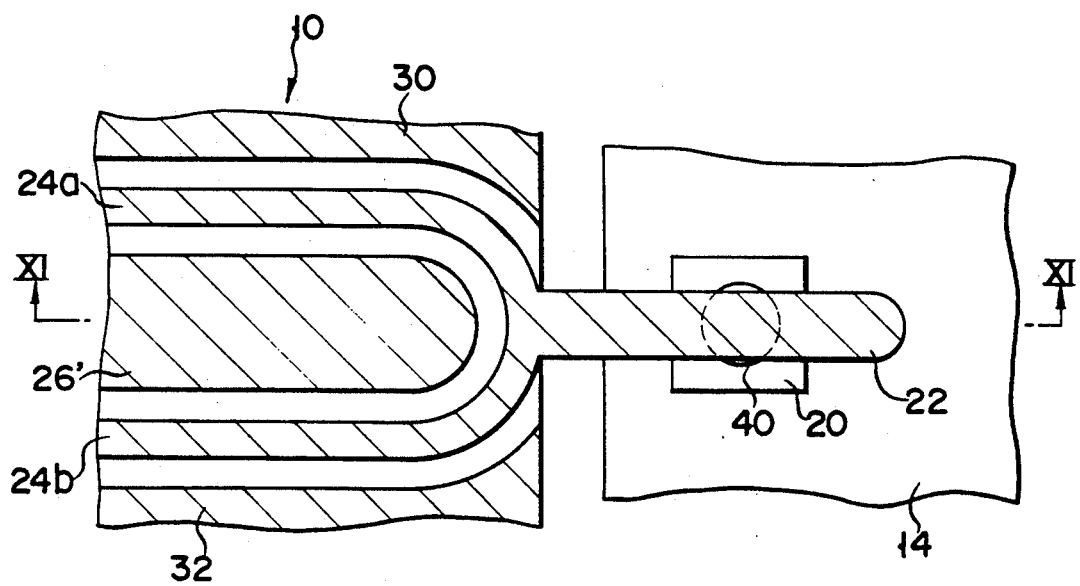
FIG. 10 is a diagram showing a partial plan view of a modification of the TAB substrate in FIG. 3.
Figure 11:
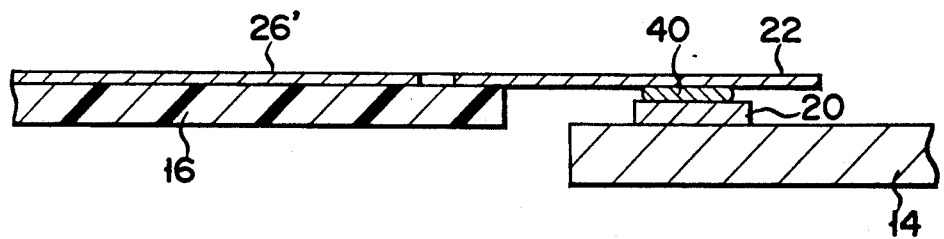
FIG. 11 is a diagram showing a sectional view taken along line XI—XI of the TAB substrate in FIG. 10.

An input wiring line portion of TAB substrate 10 according to the above-described embodiment may be modified to have only one of the "micro-strip signal transmission line structure" and the "co-planar signal transmission line structure". FIGS. 10 and 11 show a modification wherein the TAB input wiring line portion has the "co-planar signal transmission line structure", whereas FIGS. 12 and 13 show a modification wherein the TAB input wiring line portion has the "microstrip signal transmission line structure".

According to the modified TAB substrate shown in FIGS. 10 and 11, ground wiring line 26' to be formed on TAB substrate film 16 inside branch half loop pattern 4 of each TAB inner lead 22 does not have a half loop pattern. As is clearly illustrated in FIG. 10, wiring line 26' consists of a solid conductive thin film located inside branch half loop pattern 24 at a predetermined distance therefrom. N conductive film layer 34 is formed on the rear surface of TAB substrate film 16.

Figure 12:
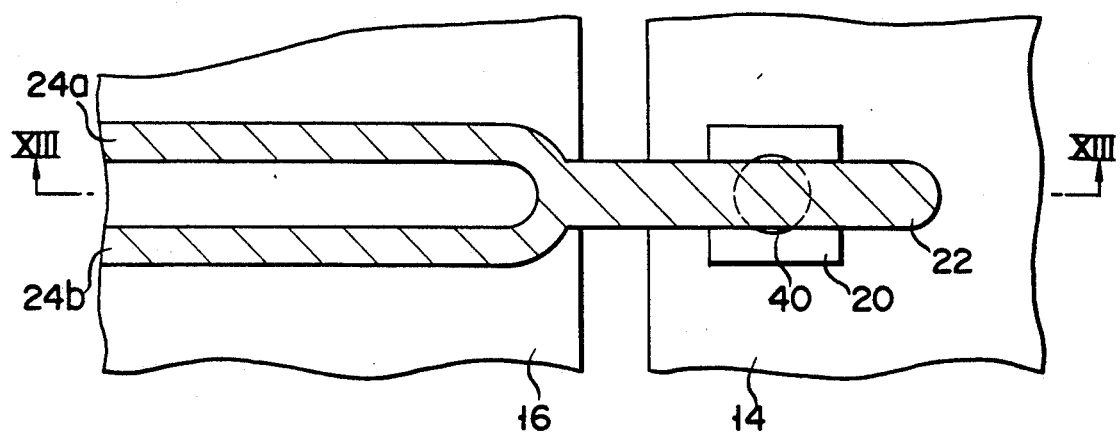
FIG. 12 is a diagram showing a partial plan view of another modification of the TAB substrate in FIG. 3.
Figure 13:
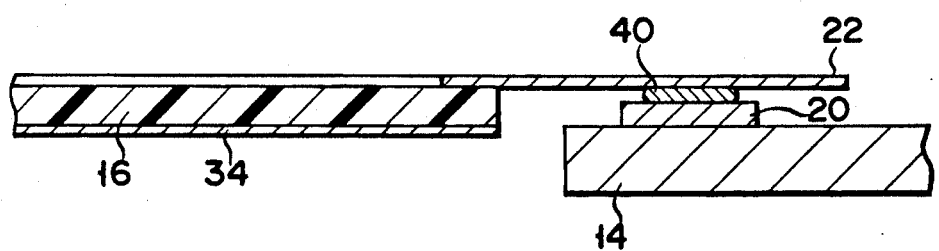
FIG. 13 is a diagram showing a sectional structure taken along line XIII—XIII of the TAB substrate in FIG. 12.

According to the modified TAB substrate shown in FIGS. 12 and 13, no ground line is formed between wiring lines 24a and 24b branching from each inner lead 22. Instead of this, ground conductive layer 34 is formed on the rear surface of TAB substrate 10 in the same manner as described in the above-described embodiment, thereby constituting the "micro-strip signal transmission line structure".

TAB substrate 50 according to a second embodiment of the present invention is featured in that end portion 52 of square opening 12 on which IC chip 14 is to be mounted has no inner leads. This second embodiment will now be described in detail with reference to FIGS. 15 to 18.

Figure 14:
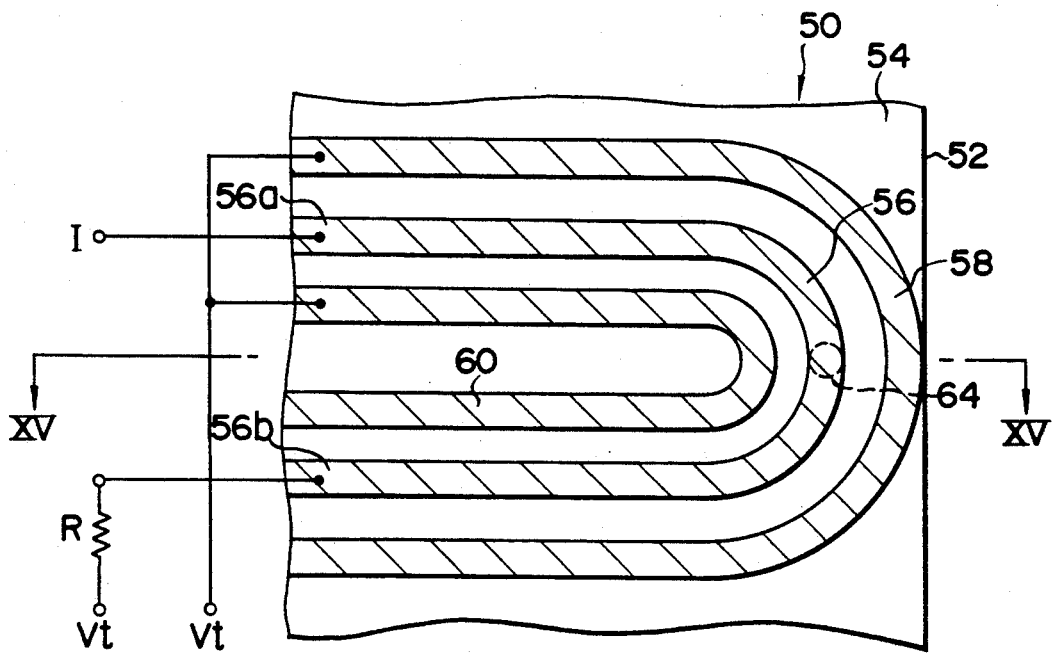
FIGS. 14 to 16 are diagrams showing partial plan views of a main part of a TAB substrate according to a second embodiment of the present invention.

As is apparent from a partially enlarged view of FIG. 14, signal input wiring line 56, which is branched according to the "feed-through" technique, and to which a high-speed input logic signal is supplied, is formed on resin film 54 of TAB substrate 50. Feed-through wiring line 56 includes half-loop-shaped branch wiring lines 56a and 56b corresponding to, e.g., branch wiring lines 22a and 22b shown in FIG. 5. Branch wiring line 56a is connected to signal input terminal I of a external printed circuit board (not shown), whereas branch wiring line 56b is connected to terminal potential Vt through impedance-matching resistor R. First conductive wiring line 58 is formed outside half-loop-shaped signal input wiring line 56 at a predetermined distance therefrom. Second conductive wiring line 60 is formed inside half-loop-shaped signal input wiring line 56 at a predetermined distance therefrom. Wiring lines 58 and 60 are connected to terminal voltage Vt.

Signal input wiring line 56 has through-hole 62 at the top of its semicircular wiring line. Through-hole 62 is constituted by a hole extending through TAB substrate film 54 and a conductive portion such as Cu material buried in this hole. Small circular conductive layer 64 to be electrically conducted to through-hole 62 is formed on the rear surface of TAB substrate 50 (see FIG. 16). Layer 64 functions as a connection terminal pad between TAB substrate 50 and IC chip 14.

IC chip 14 can be mounted on the front or rear surface of TAB substrate 50 arranged in the above-described manner. When IC chip 14 is to be mounted on the rear surface of TAB substrate 50, as shown in FIG. 17, TAB substrate 50 and IC chip 14 are positioned so as to bond corresponding terminal pad 20 of IC chip 14 to small circular terminal layer 64 of TAB substrate 50. Bonding tool 66 is urged against TAB substrate 50 from its front surface side in the same manner as described in the first embodiment. As a result, terminal layers 20 and 64 are bonded to each other through bump metal layer 40 by eutectic or thermocompression bonding.

When IC chip 14 is to be mounted on the front surface of TAB substrate 50, as shown in FIG. 18, corresponding terminal pad 20 of IC chip 14 is set upside down so as to be bonded to the top portion of the semicircular pattern of half loop wiring line 56 of TAB substrate 50. Bonding tool 66 is urged against TAB substrate 50 from its front surface side in the same manner as described in the first embodiment. As a result, terminal pad 20 and TAB wiring line 56 are bonded to each other through bump metal layer 40 by eutectic or thermocompression bonding.

Figure 19:
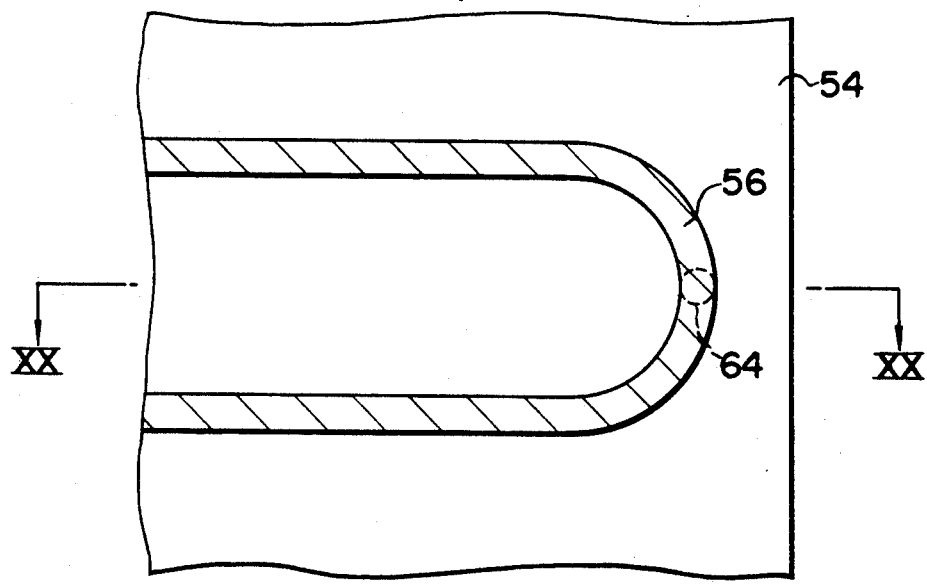
FIGS. 19 to 21 are diagrams showing a modification of the TAB substrate in FIGS. 14 to 16.
Figure 20:
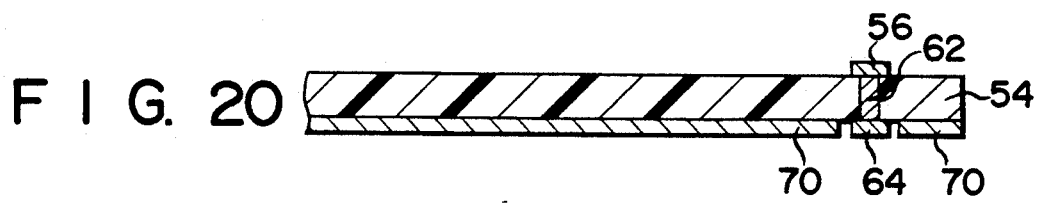
Figure 21:
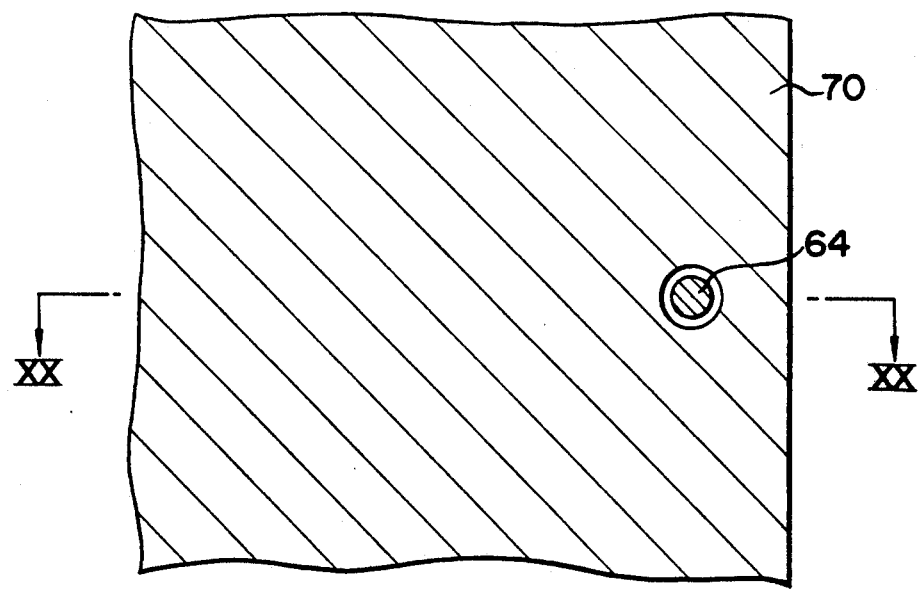

FIGS. 19 to 21 show a modification of the second embodiment, wherein no ground wiring line is formed on both the sides of feed-through wiring line 56. Instead of this, sheet-like conductive layer 70 is formed throughout the rear surface of the TAB substrate. Sheet layer 70 is connected to terminal voltage Vt and functions as a ground layer. Sheet layer 70 surrounds small circular terminal layer 64 while a predetermined space is formed therebetween. Feed-through wiring line 56 is electrically conducted to layer 64 by through-hole 62 extending through TAB substrate 50. Thus, the "microstrip signal transmission line structure" is obtained.

Figure 15:
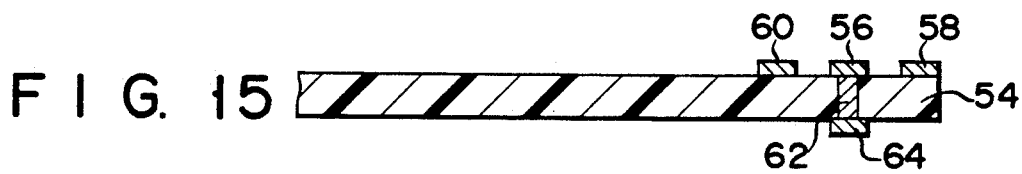
Figure 16:
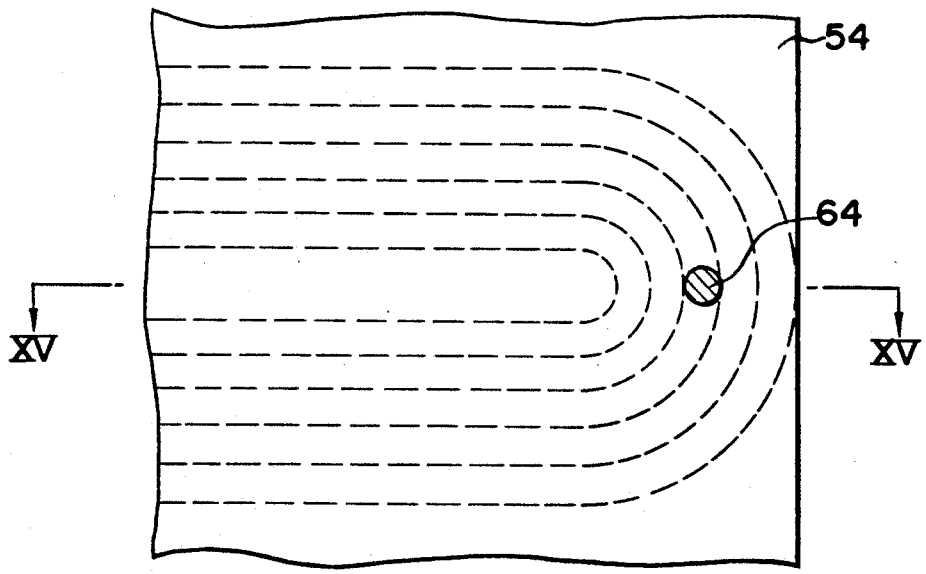
Figure 22:
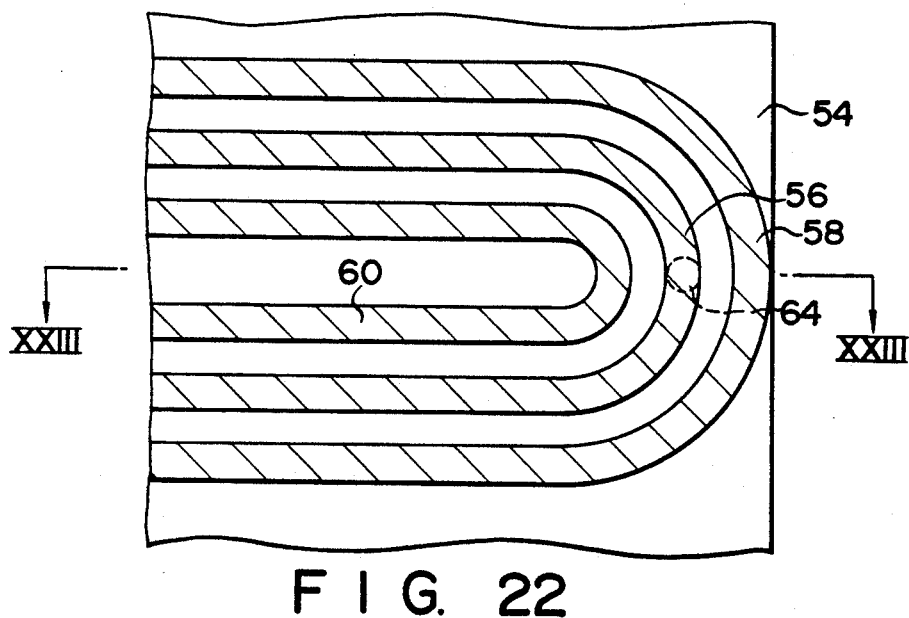
FIGS. 22 to 24 are diagrams showing another modification of the TAB substrate in FIGS. 14 to 16.
Figure 23:
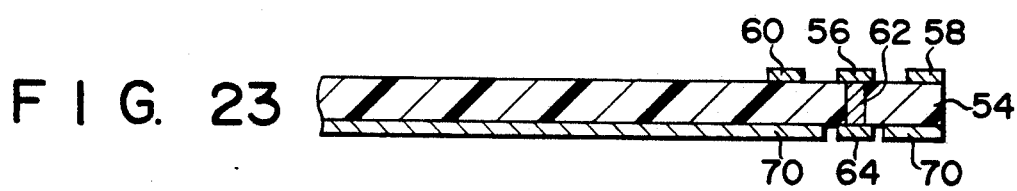
Figure 24:
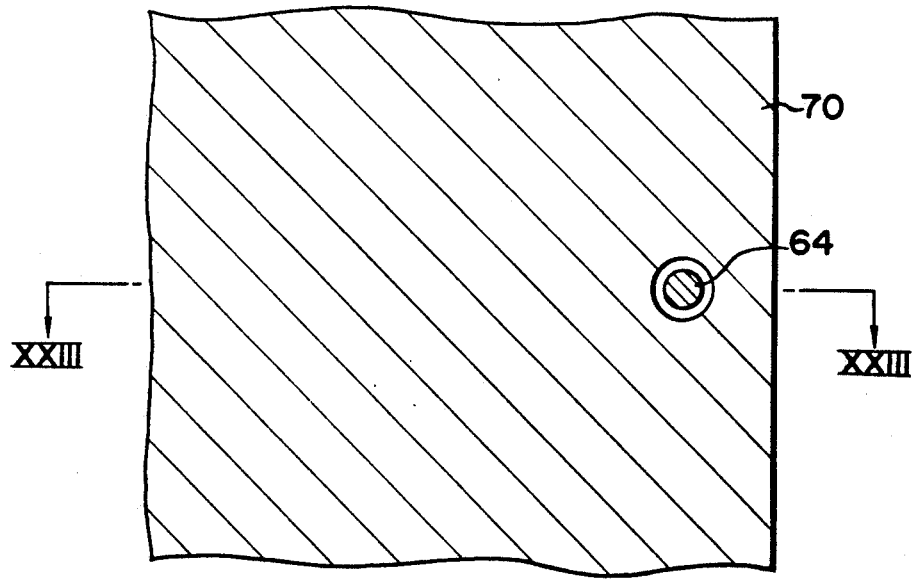

Another modification shown in FIGS. 22 to 24 is featured in that sheet-like conductive layer 70 shown in FIG. 21 is added to the second embodiment of the present invention described with reference to FIGS. 14 to 16, thereby constituting the "grounded co-planar signal transmission line structure".

A manufacturing method of the embodiment described with reference to FIGS. 14 to 25 will be described as follows. Holes serving as integrated circuit chip mounting portions and the like are formed in a 35-mm wide resin film with a perforation. Then, a 18-μm thick Cu thin-film layer is adhered to the rear surface of the resin film using a polyimide adhesive agent. The Cu thin-film layer on the rear surface is processed into a predetermined pattern by photoetching. Cu is buried in the through-hole by plating or the like. After this, another 18-μm thick Cu thin-film layer is adhered to the front surface of the resin film in the same manner as described above. The rear surface is coated with a photoresist. A photoresist having a predetermined pattern is formed on the front surface and is photoetched to form a wiring line pattern. Finally, the photoresists on the front and rear surfaces are removed. The Cu surface may be plated with Sn or Au upon adhesion of the Cu thin-film layer. The patterning order of the rear and front surfaces may be reversed.

Still another modification shown in FIGS. 25 to 27 is featured by having a double-layered TAB film structure. More specifically, according to this modification, second resin film 74 is adhered to the rear surface of resin film 54 of TAB substrate 50 shown in FIGS. 19 to 21. Sheet-like layer 70 is sandwiched between upper and lower TAB films 54 and 74. Lower resin film 74 has through-hole 76 coupled with through-hole 62 formed in upper film 54. Through-hole 76 is electrically conducted to small circular terminal layer 78 formed on an exposed surface of lower film 74. Therefore, wiring line 56 formed on upper TAB film 54 is conducted to layer 78 through two stacked through-holes 62 and 76 (intermediate pad layer 64 is sandwiched therebetween).

Figure 28:
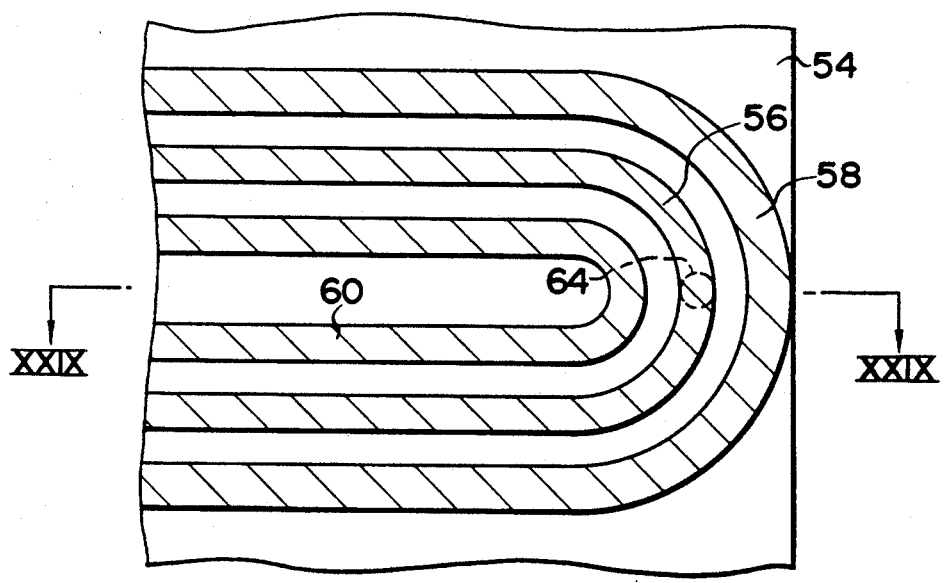
FIGS. 28 to 30 are diagrams showing still another modification of the TAB substrate in FIGS. 14 to 16.
Figure 29:
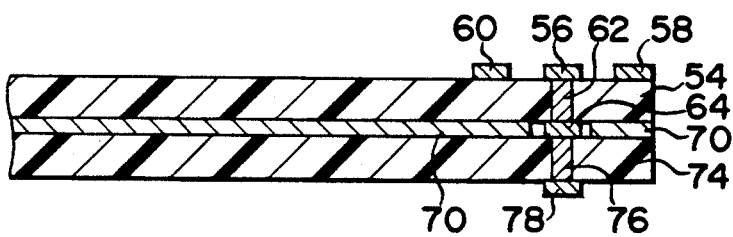
Figure 30:
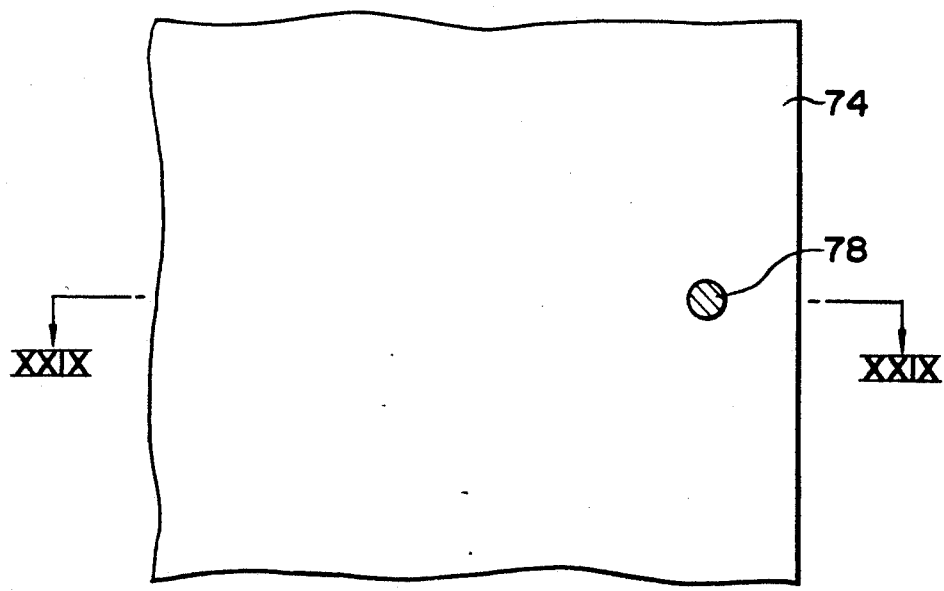

Still another modification shown in FIGS. 28 to 30 is featured in that half loop-shaped ground wiring lines 58 and 60 shown in FIG. 14 are added to TAB substrate 50 shown in FIGS. 25 to 27. Wiring lines 58 to 60 are formed on the both sides of feed-through signal wiring line 56 in the above-described manner, keeping a predetermined distance from wiring line 56. Other arrangements are the same as those of the above-described modification.

Figure 31:
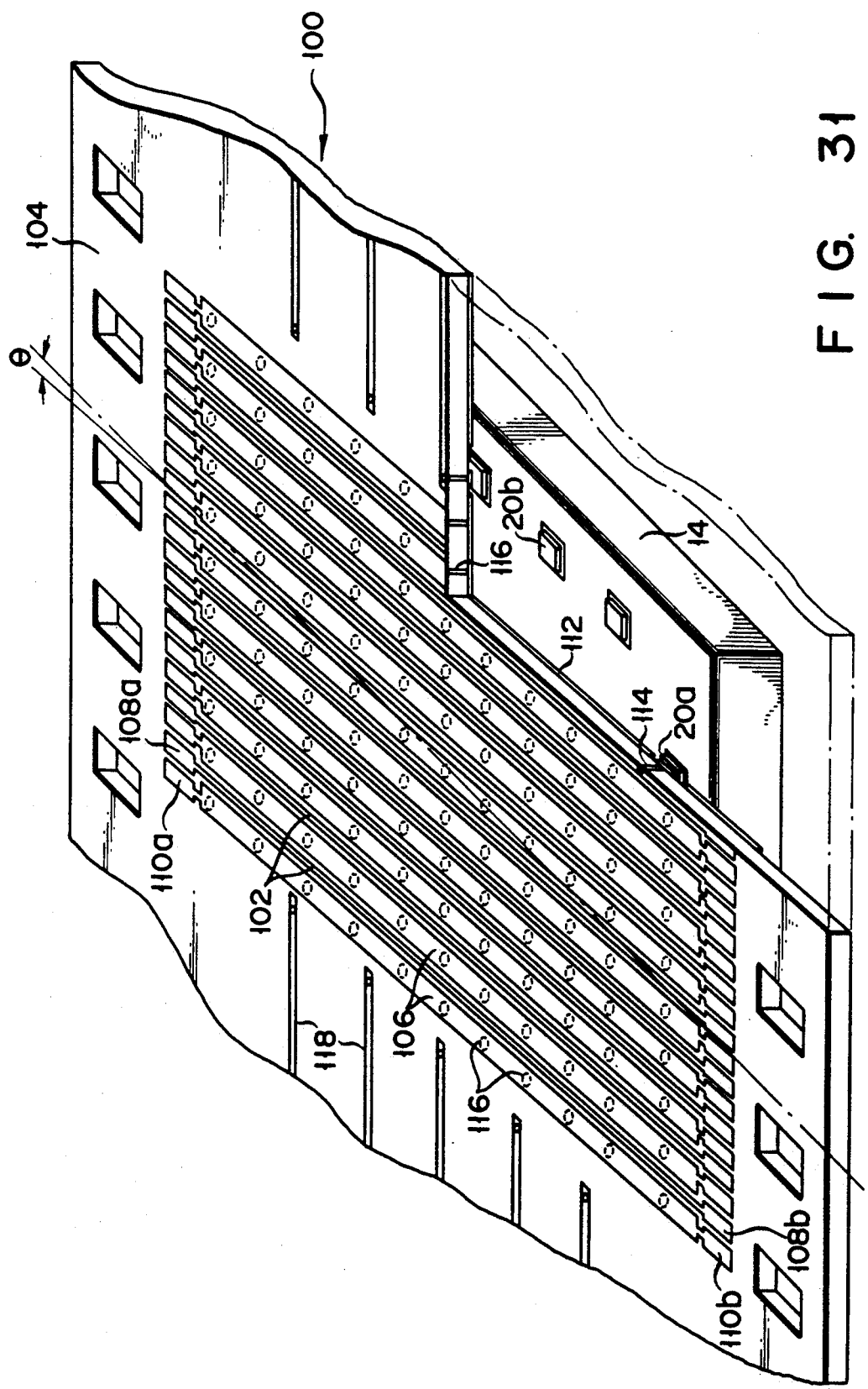
FIG. 31 is a diagram showing a partial perspective view of a main part of a TAB substrate according to a third embodiment of the present invention.

As is perspectively shown in FIG. 31, TAB substrate 100 according to a third embodiment of the present invention has feed-through signal wiring lines 102 each of which extends straight o the front surface of tape-like resin film 104. Straight conductive wiring lines 106 are formed on the both sides of each line of feed-through signal wiring lines 102 to be parallel therewith. Conductive wiring lines 106 are applied with terminal voltage Vt so as to function as ground lead wiring lines. Two ends of each feed-through signal line 102 are respectively connected to external connection terminals 108a and 108b. Two ends of each ground lead wiring line 106 are respectively connected to external connection terminals 110a and 110b. External connection terminals 108a, 110a, . . . , are alternately and linearly aligned. External connection terminals 108b, 110b, . . . , are alternately and linearly aligned. Impedance-matching resistor (terminal resistor) (not shown in FIG. 31) R is connected to one of terminals 108a and 108b of each feed-through signal wiring line 102 in the same manner as described in the above-described embodiments.

It should be noted that feed-through signal wiring lines 102 and ground lead wiring lines 106 are slanted in the widthwise direction of tape-like film 104 of TAB substrate 100 at small angle θ. In other words, straight wiring lines 102 and 106 extend at angle θ with respect to the width direction of TAB substrate 100. This state will be more clearly understood by referring to FIG. 32, which schematically shows the overall planar arrangement of wiring line pattern of TAB substrate 100 in FIG. 31.

TAB substrate 100 has sheet-like conductive layer 112 on the rear surface of resin film 104. Conductive through-holes 114 are formed in TAB resin film 104. Through-holes 114 are formed in straight feed-through signal wiring lines 102 so as to correspond to the arrangement of connecting terminal pads 20a serving as high-speed signal input terminals of IC chip 14. Through-holes 114, therefore, function as IC connecting through-holes. Sheet-like layer 112 surrounds through-holes 114 so as to be electrically separated therefrom. In addition, conductive through-holes 116 are formed in TAB resin film 104. Through-holes 116 are formed at an equal pitch along each ground lead wiring line 106. Through-holes 116 function to cause lead wiring lines 106 to be electrically conducted to sheet-like layer 112.

TAB substrate 100 has signal wiring lines 118 on the front surface of resin film 104. Signal wiring lines 118 parallelly extend in a direction of crossing wiring lines 102 and 106, i.e., along the longitudinal direction of tape-like resin film 104. Signal wiring lines 118 have IC connecting through-holes 120 at their end portions. Through-holes 120 function to cause signal wiring lines 118 to be electrically connected to connecting terminal pads 20b serving as signal output terminals of IC chip 14.

Figure 32:
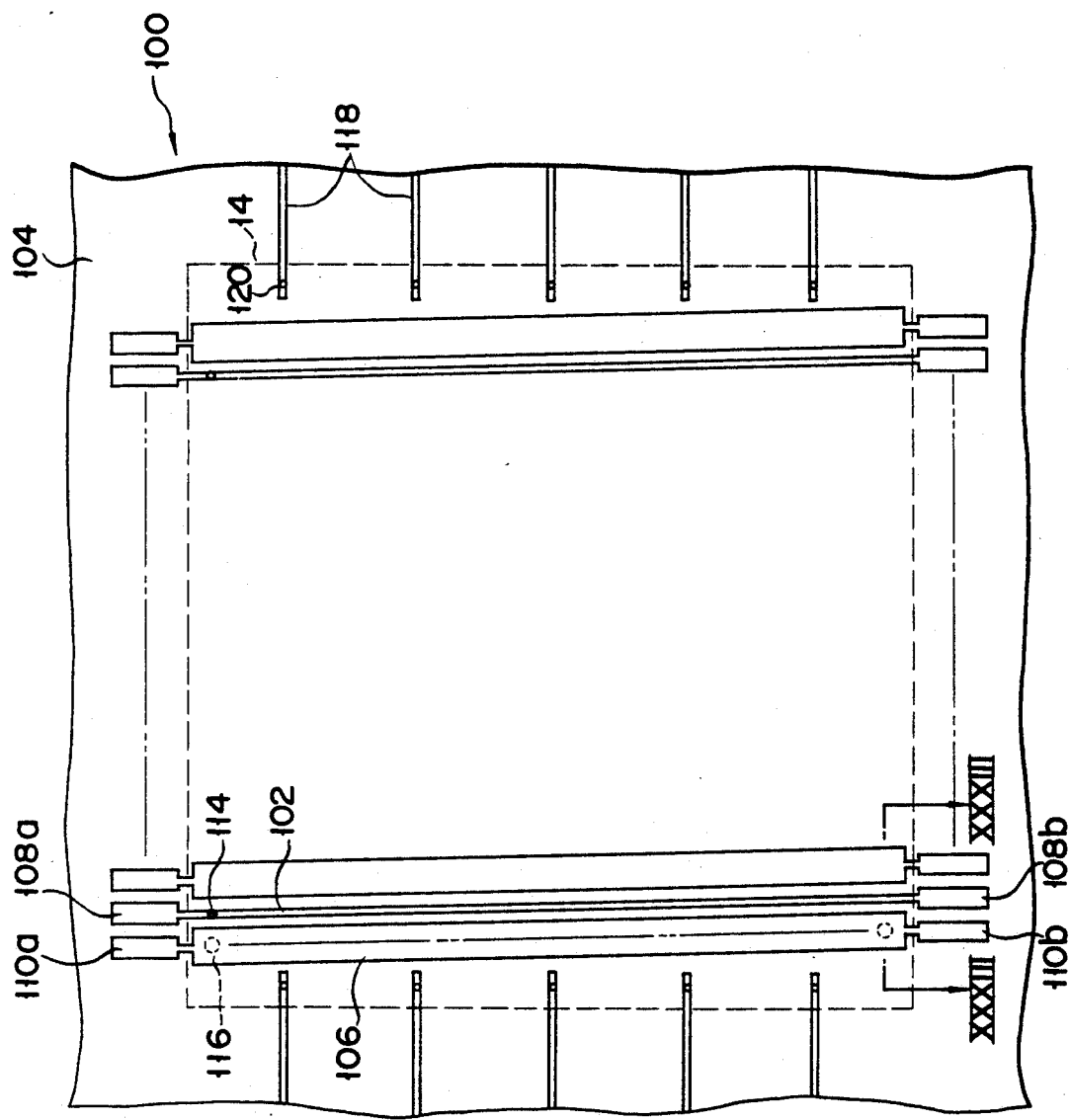
FIG. 32 is a diagram showing a plan view of the TAB substrate in FIG. 31.

FIG. 33 shows an enlarged sectional structure taken along line XXXIII—XXXIII of the plan view of TAB substrate 100 in FIG. 32. The same reference numerals are used in FIG. 33 to denote the same parts as in the above-described embodiments, and a detailed description thereof will be omitted to avoid repetition of the same description. Known passivation thin-film layer 124 is formed on IC chip 14 so as to surround high-speed signal input terminal pad 20a. Feed-through wiring line 102 is connected to small connecting layer 126 formed on the rear surface of TAB resin film 104 through corresponding through-hole 114. Small connecting layer 126 is connected to high-speed signal input terminal 20a of IC chip 14 using bump electrode 40 in the same manner as in the embodiments described above.

As shown in FIG. 34, IC chip 14 may be mounted on TAB substrate 100 from its front surface side. This arrangement can further shorten the "open stub" between IC chip 14 and TAB substrate 100 and hence is preferable.

Figure 35:
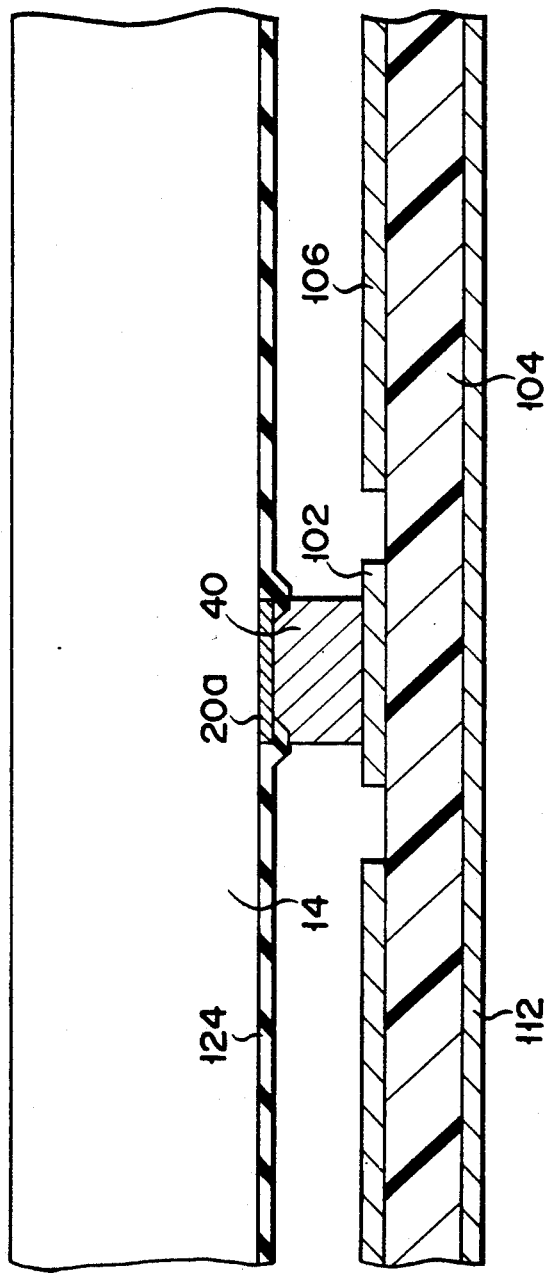
FIG. 35 is a diagram showing another modification of the sectional structure of the TAB substrate in FIG. 33.

Through-holes 114 and 116 formed in TAB resin film 104 may be omitted, as shown in FIG. 35. Similar to the case in FIG. 34, in this case, IC chip 14 is mounted on TAB substrate 100 from its front surface side in such a manner that each straight feed-through wiring line 102 is directly bonded to corresponding high-speed signal input terminal pad 20a of IC chip 14. With this arrangement, through-holes need not formed, and hence the manufacturing cost can be decreased.

In the first to third embodiments described above, TAB substrates 10, 50, and 100 are constituted by polymer resin films, and signal transmission wiring lines are defined on each TAB substrate by etching a copper thin-film layer formed thereon. If interval G between etched signal wiring lines of a TAB substrate is changed, its characteristic impedance Zo is greatly changed, as shown in FIG. 36 (in this graph, the TAB substrate has a thickness of 75 micrometers and a dielectric constant $\epsilon$ of 3.2; each of the copper thin-film layers formed on the both surfaces of the resin film has a thickness of 18 micrometers; and each feed-through signal wiring line has a width of 50 micrometers). As shown in this graph, if interval G between a feed-through signal wiring line and its neighboring line slightly varies, its characteristic impedance Zo is greatly changed. Therefore, in the manufacturing process of TAB substrate 10 of the present invention, in order to stabilize the characteristic impedance at an initially set value and obtain a high manufacturing yield, variations in characteristic impedance of actually manufactured products are required to be accurately and efficiently measured. A TAB substrate according to a fourth embodiment of the present invention to be described below is featured by comprising a test signal transmission wiring line pattern in consideration of this point.

Figure 37:
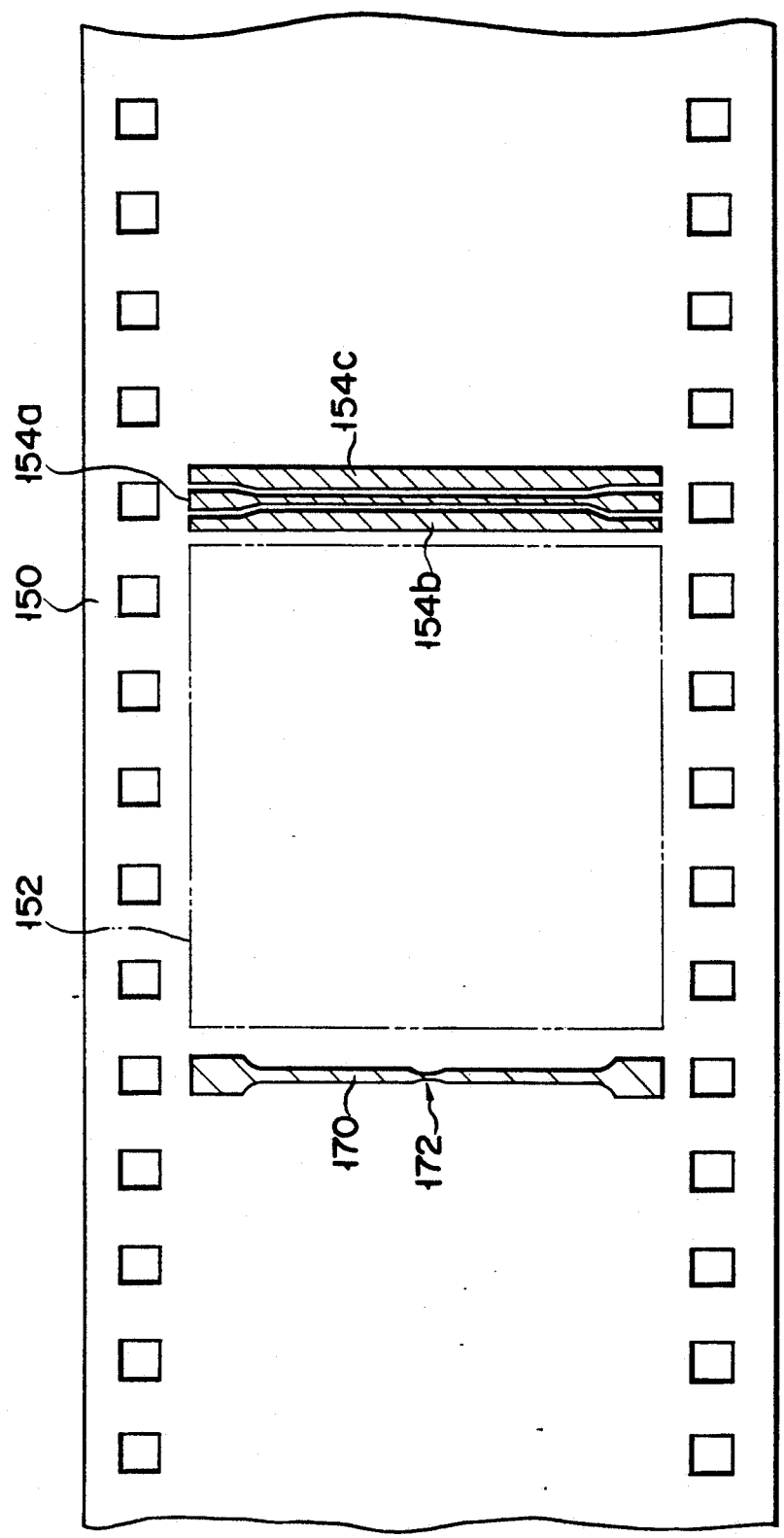
FIG. 37 is a diagram showing a plan view of a main part of a TAB substrate according to a fourth embodiment of the present invention.

Referring to FIG. 37, resin film carrier tape 150 from which a plurality of TAB substrates are cut off has single TAB substrate region 152 indicated by alternate long and two short dashed line 152. The wiring line pattern in TAB substrate region 152 may be the radial wiring line pattern of the first embodiment as illustrated in FIG. 3, or may be the parallel straight wiring line pattern of the third embodiment as illustrated in FIG. 32. Although not specifically shown in FIG. 37, such TAB substrate regions 152 ar repeatedly formed along the longitudinal direction of film tape 150, as shown in, e.g., FIG. 4.

Three test wiring lines 154a, 154b, and 154c are formed adjacent to one side of TAB substrate region 152 on tape 150. Test wiring line 154a is formed so as to correspond to a high-speed signal input wiring line to be formed in region 152. As shown in FIG. 37, wiring line 154a has pads having shapes corresponding to the external connecting terminals of the TAB substrate at its both end portions. The remaining test wiring lines 154b and 154c extend along wiring line 154a while keeping a predetermined interval therefrom.

A careful attention should be paid to the fact that these test wiring lines coincide with the structure of the feed-through signal wiring lines to be formed in TAB substrate region 152 (both the planar and sectional structures). When the feed-through signal wiring lines formed in TAB substrate region 152 have the "micro-strip signal transmission line structure" described above, test wiring lines 154 are formed to have the same structure. When feed-through signal wiring lines in TAB substrate region 152 have the "co-planar signal transmission line structure", test wiring lines 154 have the same structure. When feed-through signal wiring lines in region 152 have the composite structure of the "micro-strip signal transmission line structure" and the "co-planar signal transmission line structure" (the "grounded co-planar signal transmission line structure" or the "co-planar micro-strip signal transmission line structure"), wiring lines 154 have the same composite structure.

When the feed-through signal wiring lines formed in TAB substrate region 152 have the inner leads (denoted by reference numeral 22 in FIG. 3) as described in the first embodiment, the test wiring line pattern is arranged to have tongues 156 extending from opening 158 formed on carrier film 150, as shown in FIG. 38. In addition, as shown in FIG. 39, conductive through-hole 160 formed in film 150 may be added to cause wiring lines 154c' and 154c" formed on both the surfaces of film 150 to be electrically connected to each other. In this case, reference numerals 162 and 164 designate conductive layers to which terminal voltage Vt is applied.

Actually manufactured carrier film tape 150 having the test wiring line pattern as described above is subjected to characteristic impedance measurement using a test tool in the manufacturing process When it is found that the test wiring line pattern has a characteristic impedance corresponding to its designed values, it can be simply determined that the feed-through signal wiring lines in each TAB substrate region 152 have the same characteristic impedances as designed. If it is detected that a test wiring line pattern associated with a certain TAB substrate region has a characteristic impedance deviated from its design, the TAB substrate can be processed as a defective product in a process for cutting off TAB substrates from carrier film 150. With this operation, high-quality TAB substrates corresponding to a design can be efficiently produced.

A second feature of the fourth embodiment of the present invention is that test wiring line 170 for etching progress confirmation is arranged on the other side of each TAB substrate region 152. Test wiring line 170 has narrow portion 172 at its substantially central portion. If an etching process for forming desired feed-through signal wiring lines in each TAB substrate region 152 is excessively performed, narrow portion 172 of test wiring line 170 is dissolved and disconnected. Therefore, overetching can be easily detected by checking whether or not each test wiring line is electrically disconnected using a proper test tool in the checking process of manufacture. If electrical disconnection of test wiring line 170 is monitored using an electrical tester during the etching process of a TAB substrate, the etching amount of the TAB substrate can be controlled in a real-time manner. In this case, if TAB wiring line etching is stopped immediately when test wiring line 170 is disconnected, a TAB substrate wiring line pattern having a wiring line pitch with required precision can be manufactured by etching.

Figure 40:
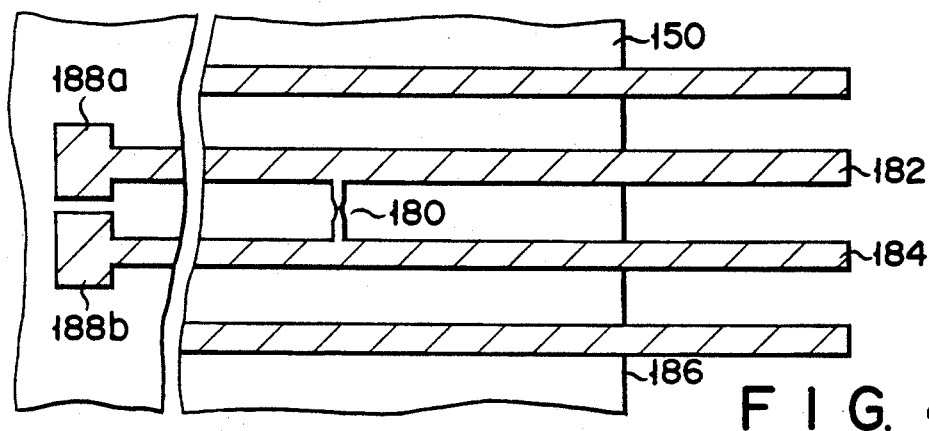
Figure 41:
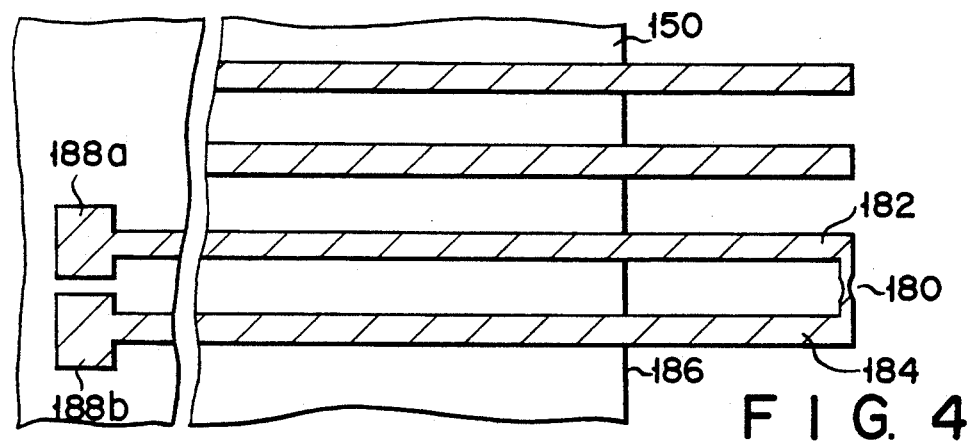

An etching progress monitoring test wiring line arrangement can be realized by adding a pattern corresponding to narrow portion 172 between prepared signal lines in TAB substrate region 152 of carrier tape 150 without using independent test wiring line 170 such as shown in FIG. 37. With this arrangement, a tape area can be saved. According to the modification shown in FIG. 40, test wiring line 180 having a narrow portion is formed between two neighboring lead lines 182 and 184 extending into square opening 186 (corresponding to opening 12 in FIG. 3, on which IC chip 14 is mounted) in TAB substrate region 152 of carrier tape 150. If connection between terminal pads 188a and 188b of lead lines 182 and 184 is monitored using a test tool, the same effect as described above can be obtained. Test wiring line 180 having the narrow portion may be formed between inner leads extending from chip-mounting opening 186, as shown in FIG. 41.

Figure 42:
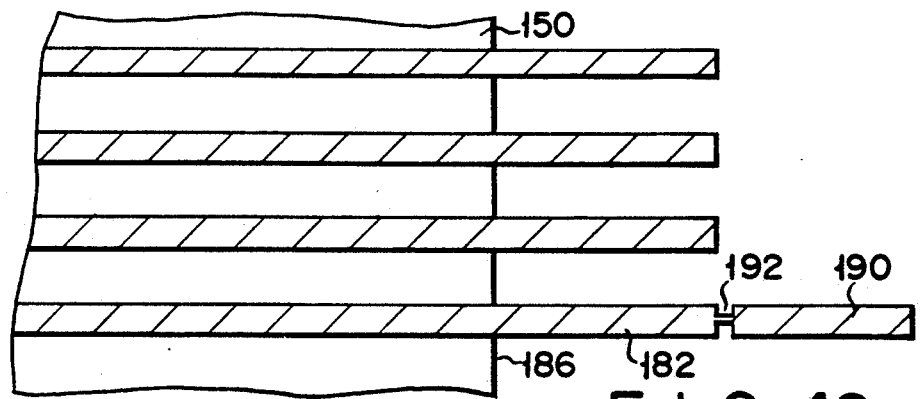

The etching progress monitoring test wiring line arrangement may be modified so as to have line pattern 190 connected to the top portion of inner lead 182 through narrow portion 192, as shown in FIG. 42. In this case, if a TAB substrate wiring line is appropriately etched, narrow portion 192 is dissolved, and line pattern 190 is separated from inner lead 182. If etching of the TAB substrate wiring line is insufficient, narrow portion 192 is not dissolved and line pattern 190 is still connected to inner lead 182. Accordingly, an inspection operator can easily inspect the wiring line etching amount of the TAB substrate visually without using any electrical test device.

What is claimed is:

1. A tape-automated bonding assembly for a semiconductor integrated circuit chip having connection terminals including a signal input terminal and a signal output terminal, said assembly comprising:
    an insulative base layer having a top surface and a bottom surface;
    conductive thin-film lead lines which are defined in a conductive thin-film layer formed on the top surface of said insulative base layer such that they extend radially and are electrically insulated from each other so as to provide a connection point to the connection terminals of said chip;
    ground-potential lines arranged on the top surface of said base layer;
    a ground-potential layer arranged on the bottom surface of said base layer so as to provide a connection to a ground potential;
    said lead lines comprising a single-layered signal transmission line which is substantially constant in its width and connected to the signal input terminal and has a first sub-lead portion adapted to externally receive an input signal to be supplied to the signal input terminal, and a second sub-lead portion adapted to be connected to an impedance-matching resistor, and a contact portion which is integral with said signal transmission line and adapted to be bonded with the signal input terminal of said chip, thereby to eliminate use of any extra connection lead wire means; and
    said ground-potential lines including a pair of thin-film wiring lines arranged such that said signal transmission line is positioned therebetween with a distance between said signal transmission line and each of said pair of thin-film wiring lines being substantially constant.

2. The assembly according to claim 1, wherein said first and second sub-lead portions radially extend from said signal input terminal of said chip.

3. The assembly according to claim 1, wherein said first and second sub-lead portions are connected to each other so as to constitute a straight feed-through type signal wiring line.

4. The assembly according to claim 3, wherein said straight feed-through signal wiring line is slanted with respect to a line connecting two arbitrary opposite terminals of the connection terminals of said chip.

5. A tape-automated bonding package device for a semiconductor IC chip having connection terminals including signal input and output terminals, comprising:
    an insulative substrate layer having a peripheral end portion;
    a wiring line pattern defined in a conductive thin-film layer formed on said substrate layer, said wiring line pattern comprising,
    feed-through type signal input wiring lines which extend radially on said substrate layer and are connected to said signal input terminals of said chip, and each of which has a contact portion to which a corresponding one of said signal input terminals is directly connected, a first terminal for receiving an external high-speed input signal, and a second terminal to which an external impedance-matching resistor is to be connected, and
    normal-type signal output wiring lines which are connected to said signal output terminals of said chip, and each of which has a contact portion to which a corresponding one of said signal output terminals is directly connected, and a third terminal at which an output signal is generated, said first, second and third terminals being arranged along the peripheral end portion of said substrate layer;
    said feed-through type signal input wiring lines including a signal transmission lead line being substantially constant in width and a pair of ground-potential wiring liens arranged on both sides of said signal transmission lead line with a gap between said signal transission line and each of said ground-potential wiring lines being substantially constant; and
    a conductive thin-film layer arranged on a bottom surface of said substrate to be applied with a ground potential.

6. The device according to claim 5, wherein said substrate layer has, at a central region thereof, an opening in which said chip is to be mounted.

7. The device according to claim 6, wherein each of said feed-through type signal input wiring lines is bent at said contact portion thereof, and is branched into two sub-wiring lines substantially radially extending on said substrate layer from said opening.

8. The device according to claim 7, wherein said contact portion of each of said feed-through type signal input wiring lines comprises an interconnection lead extending from said opening.

9. The device according to claim 7, wherein said contact portion of each of said feed-through type signal input wiring lines comprises a conductive portion located inside said opening of said substrate layer.

10. The device according to claim 5, wherein said feed-through type signal input wiring lines extend on said substrate layer substantially parallelly and straight.

11. The device according to claim 10, wherein said contact portion of each of said feed-through type signal input wiring lines comprises a conductive through-hole formed in said substrate layer.

12. The device according to claim 5, further comprising:
    test wiring lines formed on said substrate layer and subjected to a characteristic impedance measurement test.

13. The device according to claim 5, further comprising:

a conductive wiring line pattern formed on said substrate layer and subjected to an etching amount test for obtaining said wiring line pattern.

14. The assembly according to claim 1, wherein said contact portion and said first and second sub-lead portions are formed in a metallic thin-film layer.

15. The assembly according to claim 14, wherein said thin-film layer has a projected section which corresponds to said contact portion and is directly connected to the signal input terminal of said integrated circuit chip.

16. The assembly according to claim 15, wherein said insulative base layer has an opening in which said integrated circuit chip is to be located, and wherein said projected portion extends into the opening.

17. The assembly according to claim 14, wherein said contact portion and said signal input terminal of said integrated circuit chip are overlapped each other.

18. The assembly according to claim 1, wherein said signal transmission line has a first external connection terminal portion while said ground-potential wiring lines have second external connection terminal portions the first and second terminal portions are aligned along an edge of said base layer.

19. The assembly according to claim 18, wherein said ground-potential layer has a limited area so as to cause said first and second terminal portions to be prevented from overlapping said ground-potential layer.

20. The assembly according to claim 19, wherein said signal transmission line so shaped as to gradually increase in width in a specific area near said first connection terminal portion and prevented from overlapping said ground-potential layer.

* * * * *